(12) United States Patent
Okumoto et al.

(10) Patent No.: US 8,907,344 B2
(45) Date of Patent: Dec. 9, 2014

(54) THIN-FILM TRANSISTOR DEVICE AND METHOD FOR MANUFACTURING SAME, ORGANIC ELECTROLUMINESCENT DISPLAY ELEMENT, AND ORGANIC ELECTROLUMINESCENT DISPLAY DEVICE

(71) Applicant: Panasonic Corporation, Osaka (JP)

(72) Inventors: Yuko Okumoto, Osaka (JP); Akihito Miyamoto, Osaka (JP); Takaaki Ukeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/968,559

(22) Filed: Aug. 16, 2013

(65) Prior Publication Data

US 2014/0034933 A1 Feb. 6, 2014

Related U.S. Application Data

(63) Continuation of application No. PCT/JP2012/006007, filed on Sep. 21, 2012.

(30) Foreign Application Priority Data

Nov. 14, 2011 (JP) .................... 2011-248805

(51) Int. Cl.
*H01L 29/768* (2006.01)
*H01L 27/32* (2006.01)
*H01L 27/12* (2006.01)
*H01L 51/00* (2006.01)
*H01L 51/05* (2006.01)
*H01L 27/28* (2006.01)

(52) U.S. Cl.
CPC ........ *H01L 27/3258* (2013.01); *H01L 27/1225* (2013.01); *H01L 27/1292* (2013.01); *H01L 51/0005* (2013.01); *H01L 51/0558* (2013.01); *H01L 27/283* (2013.01); *H01L 27/3262* (2013.01)
USPC ........ 257/59; 257/40; 257/368; 257/E51.005; 438/161; 438/99; 438/22

(58) Field of Classification Search
USPC .................... 257/40, 43, 59, 72, 79–83, 100; 438/25–29, 34, 48, 99, 104, 149, 161, 438/197; 313/483, 500–506
See application file for complete search history.

(56) References Cited

U.S. PATENT DOCUMENTS

| 5,443,922 | A | 8/1995 | Nishizaki et al. |
| 7,772,622 | B2 * | 8/2010 | Fujimori et al. .............. 257/286 |

(Continued)

FOREIGN PATENT DOCUMENTS

| JP | 5-163488 | 6/1993 |
| JP | 2004-335851 | 11/2004 |

(Continued)

OTHER PUBLICATIONS

United States office action, mailed Jun. 16, 2014, in U.S. Appl. No. 13/968,567.

(Continued)

*Primary Examiner* — Cheung Lee
*Assistant Examiner* — Stephen Bradley
(74) *Attorney, Agent, or Firm* — Greenblum & Bernstein, P.L.C.

(57) ABSTRACT

A thin film transistor element is formed in each of adjacent first and second apertures defined by partition walls. In plan view of a bottom portion of the first aperture, a center of area of a liquid-philic layer portion is offset from a center of area of the bottom portion in a direction opposite a direction of the second aperture, and in plan view of a bottom portion of the second aperture, a center of area of a liquid-philic layer portion is offset from a center of area of the bottom portion in a direction opposite a direction of the first aperture.

15 Claims, 12 Drawing Sheets

(56) References Cited

U.S. PATENT DOCUMENTS

| | | | |
|---|---|---|---|
| 8,729,534 | B2 | 5/2014 | Yoshida et al. |
| 2007/0109457 | A1 | 5/2007 | Song et al. |
| 2007/0117298 | A1 | 5/2007 | Fujimori et al. |
| 2007/0166855 | A1 | 7/2007 | Lee et al. |
| 2009/0224664 | A1 | 9/2009 | Yoshida et al. |
| 2011/0014389 | A1* | 1/2011 | Ito .................... 427/535 |
| 2011/0254003 | A1 | 10/2011 | Tsuzuki et al. |
| 2013/0328034 | A1* | 12/2013 | Okumoto et al. ......... 257/40 |

FOREIGN PATENT DOCUMENTS

| | | |
|---|---|---|
| JP | 2007-88471 | 4/2007 |
| JP | 2007-142305 | 6/2007 |
| JP | 2008-227141 | 9/2008 |
| JP | 2008-288313 | 11/2008 |
| JP | 2009-76791 | 4/2009 |
| JP | 2009-272523 | 11/2009 |
| JP | 2010-93093 | 4/2010 |
| WO | 2008/149498 | 12/2008 |
| WO | 2010/058662 | 5/2010 |
| WO | 2011/132215 | 10/2011 |
| WO | 2012/035281 | 3/2012 |

OTHER PUBLICATIONS

International Search Report and Written Opinion of PCT/JP2011/003547, mailing date is Sep. 20, 2011, together with English translation of ISR.

International Search Report and Written Opinion of PCT/JP2012/005995, mailing date is Dec. 4, 2012, together with English translation of ISR.

International Search Report and Written Opinion of PCT/JP2012/005999, mailing date is Dec. 11, 2012, together with English translation of ISR.

International Search Report and Written Opinion of PCT/JP2012/006007, mailing date is Dec. 4, 2012, together with English translation of ISR.

International Search Report and Written Opinion of PCT/JP2012/006000, mailing date is Dec. 11, 2012, together with English translation of ISR.

International Search Report and Written Opinion of PCT/JP2011/003549, mailing date is Sep. 20, 2011, together with English translation of ISR.

International Search Report and Written Opinion of PCT/JP2012/005996, mailing date is Dec. 11, 2012, together with English translation of ISR.

U.S. Appl. No. 14/059,559 to Yuko Okumoto et al., filed Oct. 22, 2013.

U.S. Appl. No. 14/061,057 to Yuko Okumoto et al., filed Oct. 23, 2013.

U.S. Appl. No. 13/968,571 to Yuko Okumoto et al., filed Aug. 16, 2013.

U.S. Appl. No. 13/968,549 to Yuko Okumoto et al., filed Aug. 16, 2013.

U.S. Appl. No. 13/968,567 to Yuko Okumoto et al., filed Aug. 16, 2013.

U.S. Appl. No. 13/968,556 to Yuko Okumoto et al., filed Aug. 16, 2013.

* cited by examiner

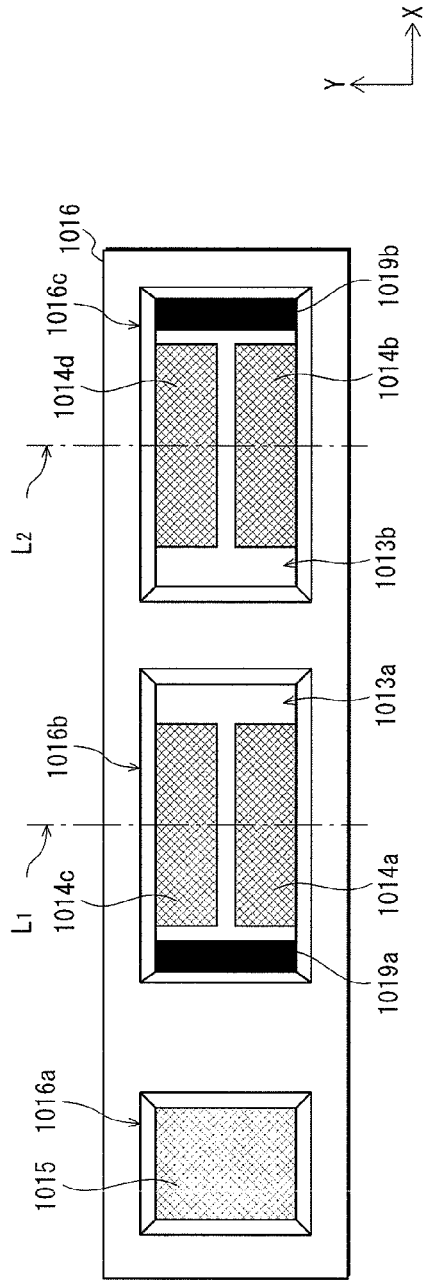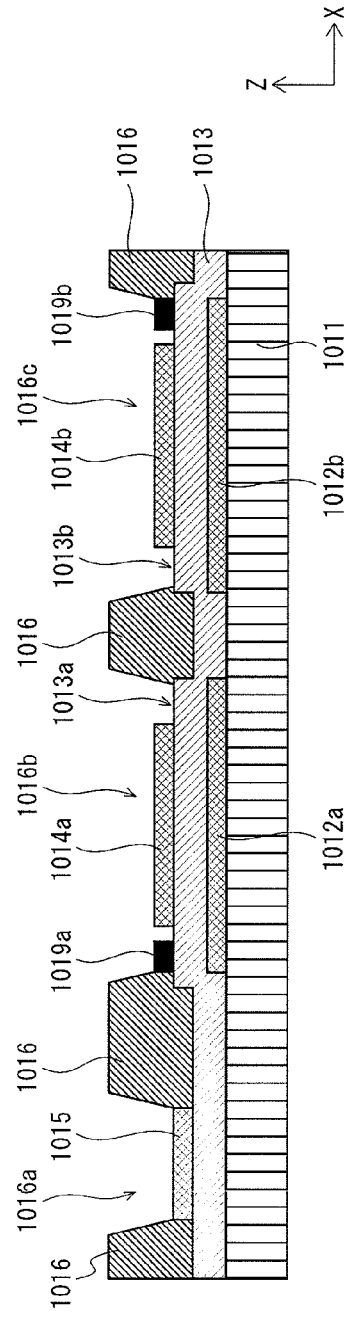
FIG. 3A
FIG. 3B

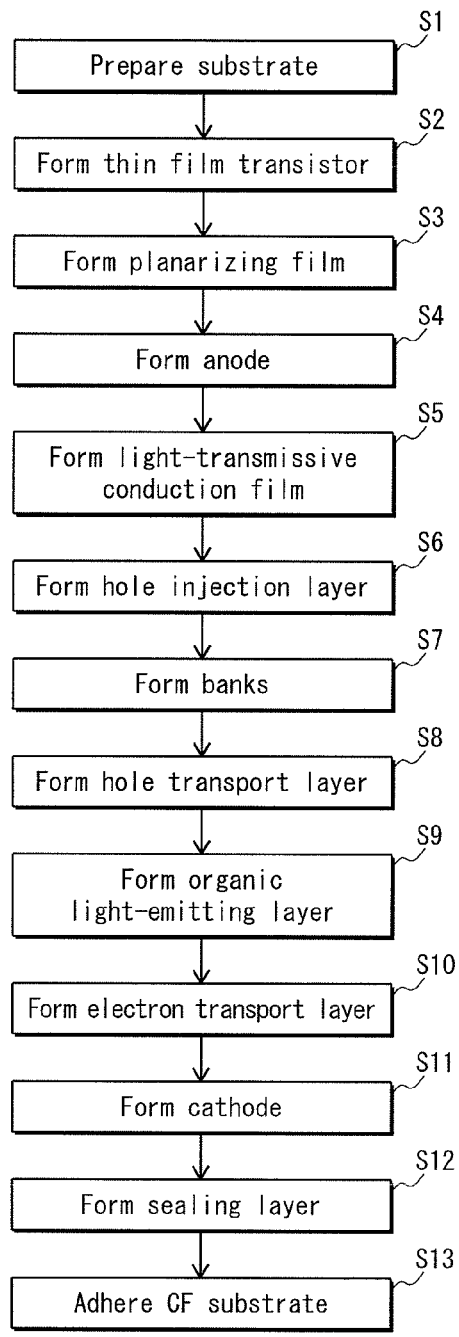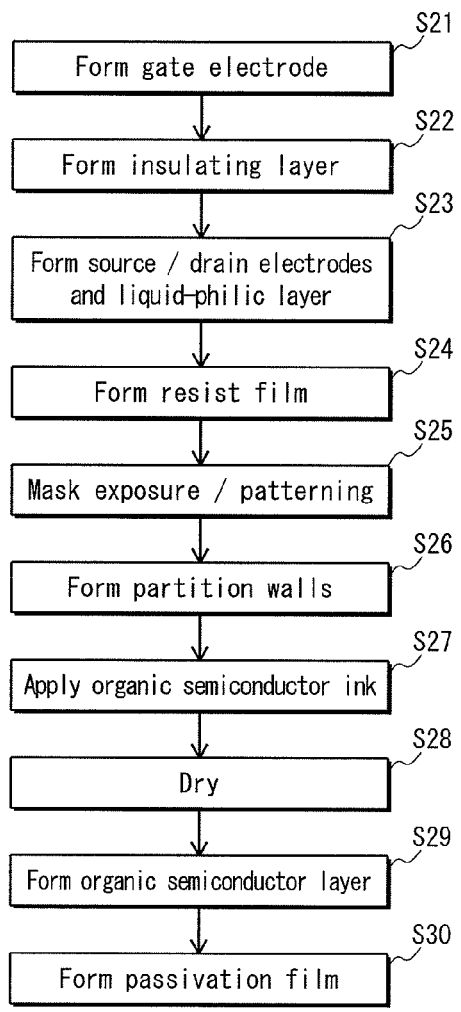

FIG. 4A

- S1 Prepare substrate
- S2 Form thin film transistor
- S3 Form planarizing film
- S4 Form anode
- S5 Form light-transmissive conduction film
- S6 Form hole injection layer
- S7 Form banks
- S8 Form hole transport layer
- S9 Form organic light-emitting layer
- S10 Form electron transport layer
- S11 Form cathode
- S12 Form sealing layer
- S13 Adhere CF substrate

FIG. 4B

- S21 Form gate electrode
- S22 Form insulating layer
- S23 Form source / drain electrodes and liquid-philic layer
- S24 Form resist film
- S25 Mask exposure / patterning
- S26 Form partition walls
- S27 Apply organic semiconductor ink
- S28 Dry
- S29 Form organic semiconductor layer
- S30 Form passivation film

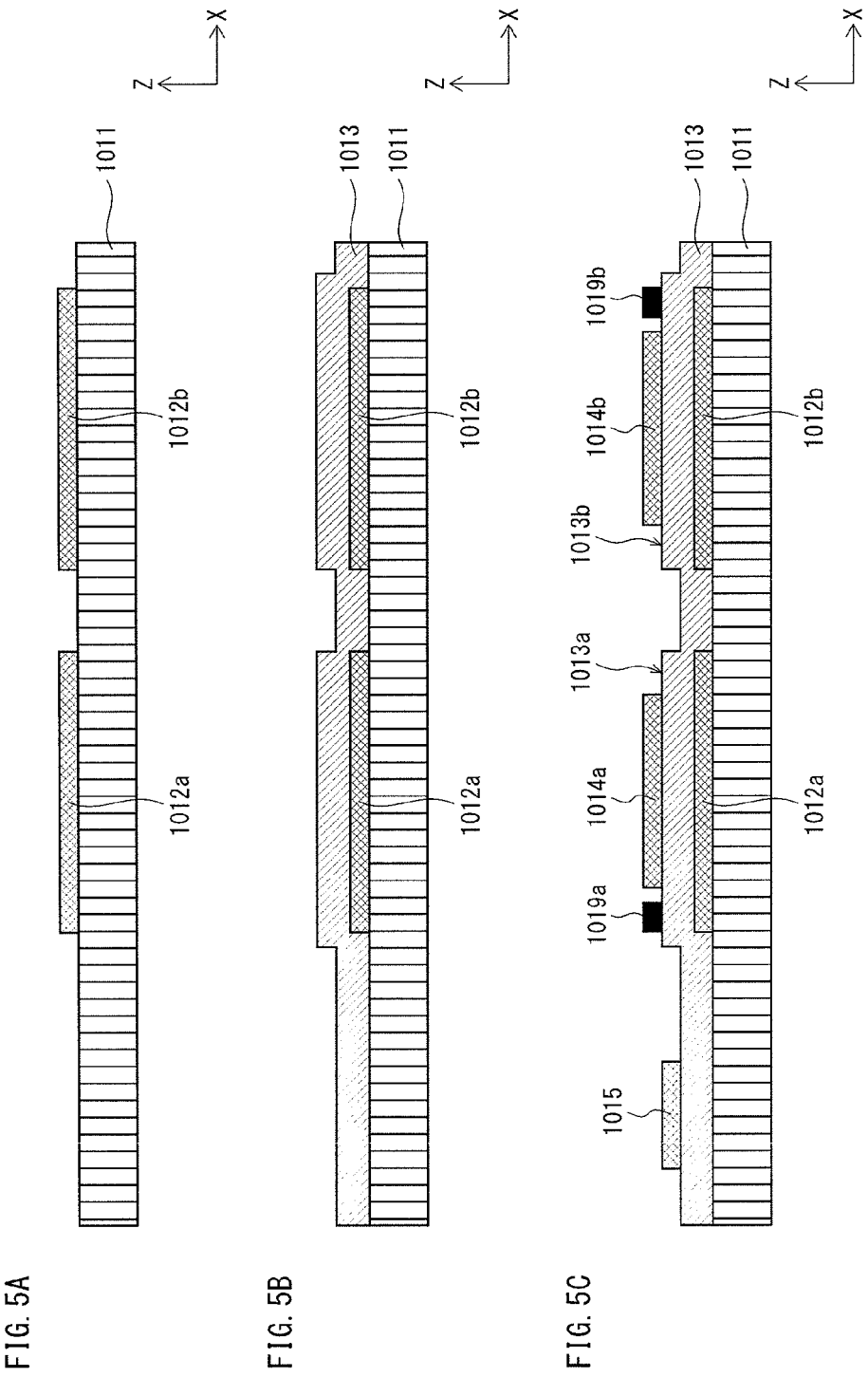

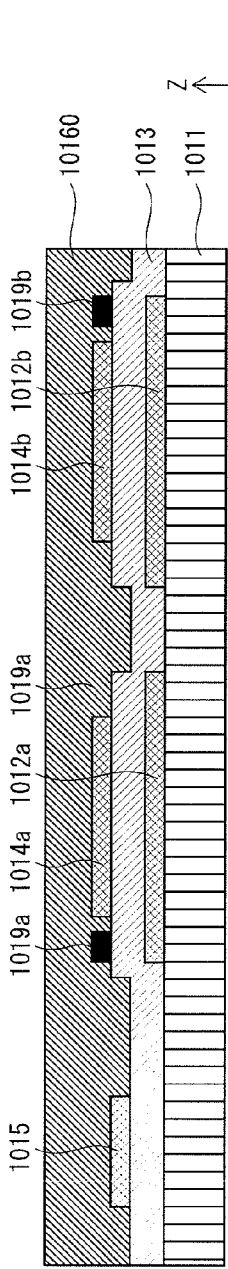
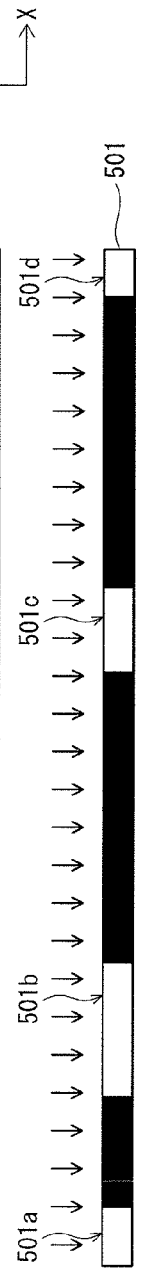
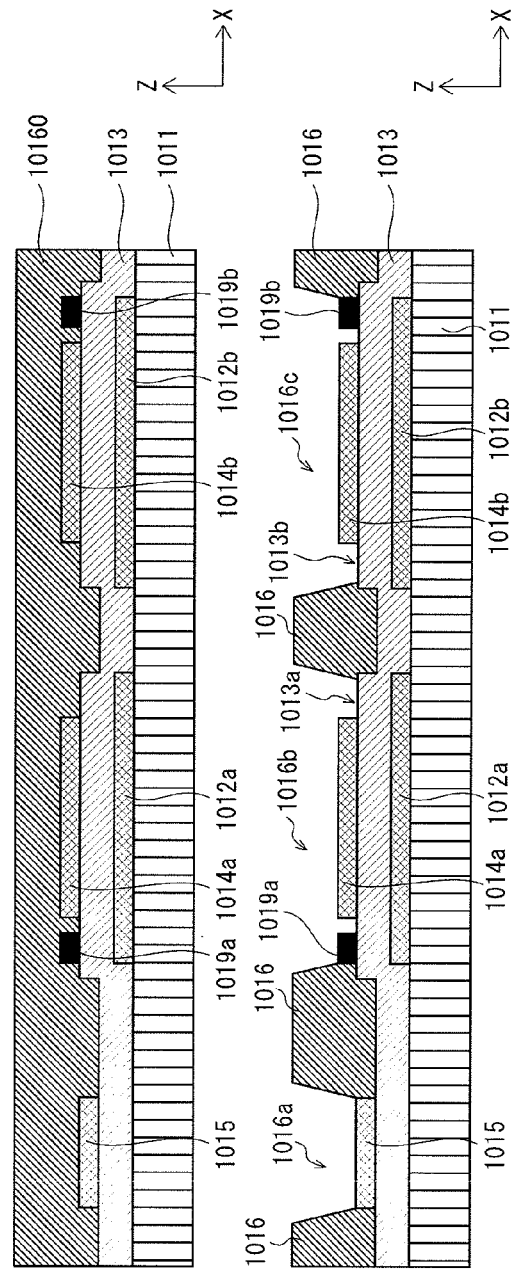
FIG. 6A
FIG. 6B
FIG. 6C

THIN-FILM TRANSISTOR DEVICE AND METHOD FOR MANUFACTURING SAME, ORGANIC ELECTROLUMINESCENT DISPLAY ELEMENT, AND ORGANIC ELECTROLUMINESCENT DISPLAY DEVICE

CROSS REFERENCE TO RELATED APPLICATION

This is a continuation application of PCT Application No. PCT/JP2012/006007 filed Sep. 21, 2012, designating the United States of America, the disclosure of which, including the specification, drawings and claims, is incorporated herein by reference in its entirety.

TECHNICAL FIELD

The present disclosure relates to a thin film transistor device and a manufacturing method thereof, an organic EL display element, and an organic EL display device.

DESCRIPTION OF THE RELATED ART

In liquid crystal display panels and organic EL display panels, control of light emission is performed in units of subpixels. To make this possible, thin film transistor devices are used in liquid crystal display panels and organic EL display panels. A thin film transistor device includes a thin film transistor (TFT) element formed for each subpixel. In particular, development is in progress of a thin film transistor device that includes a semiconductor layer formed by using organic semiconductor material.

As illustrated in FIG. 12A, a conventional organic TFT device includes, for instance: a substrate 9011; gate electrodes 9012a, 9012b; an insulating layer 9013; source electrodes 9014a, 9014b; drain electrodes (undepicted); and organic semiconductor layers 9017a, 9017b. The gate electrodes 9012a, 9012b, the insulating layer 9013, the source electrodes 9014a, 9014b, the drain electrodes, and the organic semiconductor layers 9017a, 9017b are formed by being layered one on top of another in the stated order on the substrate 9011. The organic semiconductor layers 9017a, 9017b are formed by applying organic semiconductor ink onto the insulating layer 9013 and by drying the applied organic semiconductor ink. The organic semiconductor layer 9017a is formed so as to fill the gap between the source electrode 9014a and the corresponding drain electrode and cover the source electrode 9014a and the corresponding drain electrode. Similarly, the organic semiconductor layer 9017b is formed so as to fill the gap between the source electrode 9014b and the corresponding drain electrode and cover the source electrode 9014b and the corresponding drain electrode.

In addition, as illustrated in FIG. 12A, partition walls 9016 are formed on the insulating layer 9013. The partition walls 9016 partition adjacent TFT elements from one another. The partition walls 9016 define a plurality of apertures, namely apertures 9016a through 9016c. The aperture 9016a has a bottom portion where a connection wire 9015 that is connected with a drain electrode remains exposed. Further, an organic semiconductor layer is not formed with respect to the aperture 9016a. The connection wire 9015 is an electrode to be connected to an electrode of a light-emitting element portion to be formed above the TFT element. On the other hand, the organic semiconductor layers 9017a, 9017b are formed with respect to the apertures 9016b, 9016c, respectively. Note that the organic semiconductor layers 9017a, 9017b are partitioned from one another.

As already discussed above, a TFT device such as the organic TFT device illustrated in FIG. 12A is used in a liquid crystal display panel, an organic EL display panel, or the like. Further, each TFT element in such a TFT device controls light emission of a light-emitting element portion according to signals input to the gate electrodes 9012a, 9012b, for instance, in the case illustrated in FIG. 12A.

CITATION LIST

Patent Literature

[Patent Literature 1]
  Japanese Patent Application Publication No. 2009-76791

SUMMARY

However, in the organic TFT device pertaining to conventional technology as described above, there is a risk of a situation taking place where, upon application of organic semiconductor ink for forming the organic semiconductor layers 9017a, 9017b, organic semiconductor ink applied with respect to the aperture 9016b meet and blend with organic semiconductor ink applied with respect to the adjacent aperture 9016c. In specific, as illustrated in FIG. 12B, when respectively dropping organic semiconductor ink 90170a, 90170b with respect to the apertures 9016b, 9016c defined by the partition walls 9016, there are cases where the organic semiconductor ink 90170a and the organic semiconductor ink 90170b run into and blend with each other (as indicated by arrow $F_{90}$ in FIG. 12B). This results in the organic semiconductor layers 9017a, 9017b being provided with undesirable layer-thicknesses. Further, when it is desired to form each of the organic semiconductor layers 9017a, 9017b as an organic semiconductor layer containing different components from the other, the above-described meeting and blending of organic semiconductor ink results in degradation of transistor performance.

It can be assumed that the above-described problem is likely to occur especially in a liquid crystal display panel, an organic EL display panel, etc. This is since, as already described above, there is a demand for realizing a liquid crystal display panel, an organic EL display panel, etc., with higher definition, which gives rise to a demand for downsizing subpixels therein. When the downsizing of subpixels is performed in response to such a demand, the distance between the aperture 9016b and the aperture 9016c is shortened, and the risk increases of the organic semiconductor ink 90170a and the organic semiconductor ink 90170b meeting and blending with each other. As such, the above-described problem is likely to take place.

Note that the same problems as described above can be expected to occur when an inorganic semiconductor layer is to be formed according to the application method.

Non-limiting and exemplary embodiments provide a thin film transistor device having high quality and a manufacturing method thereof, an organic EL display element, and an organic EL display device. Such a high-quality thin film transistor device is realized by preventing semiconductor ink applied with respect to one aperture from meeting and blending with semiconductor ink applied with respect to an adjacent aperture when dropping the semiconductor ink with respect to the apertures.

In one general aspect, the techniques disclosed here feature a thin film transistor device having the following structure.

The thin film transistor device comprises: a first thin film transistor element and a second thin film transistor element that are arranged so as to be adjacent to each other with a gap therebetween, wherein each of the first thin film transistor element and the second thin film transistor element comprises: a gate electrode; an insulating layer disposed on the gate electrode; a source electrode and a drain electrode disposed on the insulating layer with a gap therebetween; a semiconductor layer disposed on the source electrode and the drain electrode so as to cover the source electrode and the drain electrode and fill the gap between the source electrode and the drain electrode, and being in contact with the source electrode and the drain electrode; and a liquid-philic layer disposed on the insulating layer and having higher liquid philicity than the insulating layer, the liquid-philic layer being separate from the source electrode and the drain electrode.

The thin film transistor device further comprises partition walls disposed on the insulating layer and partitioning the semiconductor layer of the first thin film transistor element from the semiconductor layer of the second thin film transistor element, the partition walls having liquid-repellant surfaces and defining a first aperture and a second aperture.

In the thin film transistor device, the first aperture surrounds at least a part of each of the source electrode, the drain electrode, and the liquid-philic layer of the first thin film transistor element, the second aperture is adjacent to the first aperture and surrounds at least a part of each of the source electrode, the drain electrode, and the liquid-philic layer of the second thin film transistor element, a bottom portion of each of the first and second apertures includes a source electrode portion being a bottom portion of the source electrode, a drain electrode portion being a bottom portion of the drain electrode, and a liquid-philic layer portion being a bottom portion of the liquid-philic layer, in plan view of the bottom portion of the first aperture, a center of area of the liquid-philic layer portion is offset from a center of area of the bottom portion in a direction opposite a direction of the second aperture, and in plan view of the bottom portion of the second aperture, a center of area of the liquid-philic layer portion is offset from a center of area of the bottom portion in a direction opposite a direction of the first aperture.

In the thin film transistor device, at the bottom portion of the first aperture, the center of area of the liquid-philic layer portion is offset from the center of area of the bottom portion in the direction opposite the direction of the second aperture, and at the bottom portion of the second aperture, the center of area of the liquid-philic layer portion is offset from the center of area of the bottom portion in the direction opposite the direction of the first aperture. Due to this, when application (dropping) of semiconductor ink for forming semiconductor layers is performed in the manufacture of the thin film transistor device, a portion of the surface of semiconductor ink applied with respect to the first aperture having the greatest height is offset from the center of area of the first aperture in the direction opposite the direction of the second aperture, and a portion of the surface of the semiconductor ink applied with respect to the second aperture having the greatest height is offset from the center of area of the second aperture in the direction opposite the direction of the first aperture, and thus are distant from each other.

By disposing the liquid-philic layer portion, which has higher wettability compared to a surface of the insulating layer, at each of the bottom portions of the first and second apertures in an offset arrangement, the surface of the semiconductor ink applied with respect to the first aperture is biased in a direction departing from the second aperture, and similarly, the surface of the semiconductor ink applied with respect to the second aperture is biased in a direction departing from the first aperture. As such, in the manufacture of the thin film transistor device, the undesirable meeting and blending of semiconductor ink applied (dropped) with respect to the first aperture and semiconductor ink applied (dropped) with respect to the second aperture is prevented.

Since the meeting and blending of semiconductor ink applied (dropped) with respect to adjacent apertures is prevented, the thin film transistor device has high quality.

These general and specific aspects may be implemented by using an organic EL display element, an organic EL display device, and a method of manufacturing a thin film transistor device.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF THE DRAWINGS

FIG. 3A is a schematic plan view illustrating a partial structure of a TFT substrate 101, and FIG. 3B is a schematic cross-sectional view illustrating a partial structure of the TFT substrate 101.

FIG. 4A is a process flow diagram providing an overview of a method of manufacturing the organic EL display panel 10, and FIG. 4B is a process flow diagram providing an overview of a method of forming the TFT substrate 101.

FIGS. 5A through 5C are schematic process diagrams illustrating some procedures among procedures involved in the manufacturing of the TFT substrate 101.

FIGS. 6A through 6C are schematic process diagrams illustrating some procedures among procedures involved in the manufacturing of the TFT substrate 101.

DETAILED DESCRIPTION

[Overview of Aspects of Present Invention]

Figure 1:
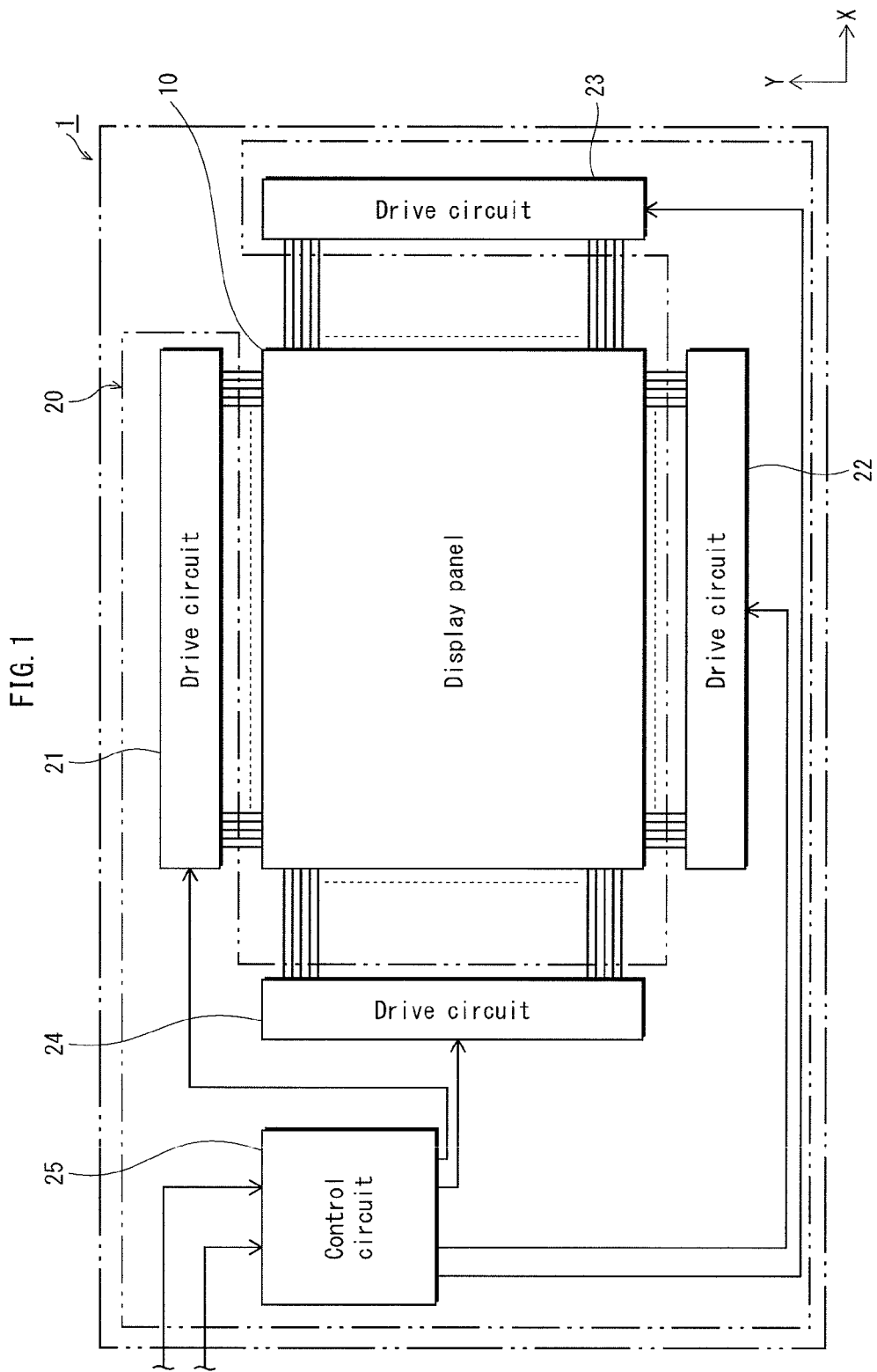
FIG. 1 is a schematic block diagram illustrating an overall structure of an organic EL display device 1 pertaining to embodiment 1.

One aspect of the present invention is a thin film transistor device comprising: a first thin film transistor element and a second thin film transistor element that are arranged so as to be adjacent to each other with a gap therebetween, wherein each of the first thin film transistor element and the second thin film transistor element comprises: a gate electrode; an insulating layer disposed on the gate electrode; a source electrode and a drain electrode disposed on the insulating layer with a gap therebetween; a semiconductor layer disposed on the source electrode and the drain electrode so as to cover the source electrode and the drain electrode and fill the gap between the source electrode and the drain electrode, and being in contact with the source electrode and the drain electrode; and a liquid-philic layer disposed on the insulating layer and having higher liquid philicity than the insulating layer, the liquid-philic layer being separate from the source electrode and the drain electrode.

The thin film transistor device pertaining to one aspect of the present invention further comprises partition walls disposed on the insulating layer and partitioning the semiconductor layer of the first thin film transistor element from the semiconductor layer of the second thin film transistor element, the partition walls having liquid-repellant surfaces and defining a first aperture and a second aperture.

Further, in the thin film transistor device pertaining to one aspect of the present invention, the first aperture surrounds at least a part of each of the source electrode, the drain electrode, and the liquid-philic layer of the first thin film transistor element, the second aperture is adjacent to the first aperture and surrounds at least a part of each of the source electrode, the drain electrode, and the liquid-philic layer of the second thin film transistor element, a bottom portion of each of the first and second apertures includes a source electrode portion being a bottom portion of the source electrode, a drain electrode portion being a bottom portion of the drain electrode, and a liquid-philic layer portion being a bottom portion of the liquid-philic layer, in plan view of the bottom portion of the first aperture, a center of area of the liquid-philic layer portion is offset from a center of area of the bottom portion in a direction opposite a direction of the second aperture, and in plan view of the bottom portion of the second aperture, a center of area of the liquid-philic layer portion is offset from a center of area of the bottom portion in a direction opposite a direction of the first aperture.

In the thin film transistor device, at the bottom portion of the first aperture, the center of area of the liquid-philic layer portion is offset from the center of area of the bottom portion in the direction opposite the direction of the second aperture, and at the bottom portion of the second aperture, the center of area of the liquid-philic layer portion is offset from the center of area of the bottom portion in the direction opposite the direction of the first aperture. Due to this, when application (dropping) of semiconductor ink for forming semiconductor layers is performed in the manufacture of the thin film transistor device, a portion of the surface of semiconductor ink applied with respect to the first aperture having the greatest height is offset from the center of area of the first aperture in the direction opposite the direction of the second aperture, and a portion of the surface of the semiconductor ink applied with respect to the second aperture having the greatest height is offset from the center of area of the second aperture in the direction opposite the direction of the first aperture, and thus are distant from each other.

By disposing the liquid-philic layer portion, which has higher wettability compared to a surface of the insulating layer, at each of the bottom portions of the first and second apertures in an offset arrangement, the surface of the semiconductor ink applied with respect to the first aperture is biased in a direction departing from the second aperture, and similarly, the surface of the semiconductor ink applied with respect to the second aperture is biased in a direction departing from the first aperture. As such, in the manufacture of the thin film transistor device, the undesirable meeting and blending of semiconductor ink applied (dropped) with respect to the first aperture and semiconductor ink applied (dropped) with respect to the second aperture is prevented.

Since the meeting and blending of semiconductor ink applied (dropped) with respect to adjacent apertures is prevented, the thin film transistor device has high quality.

In the thin film transistor device pertaining to one aspect of the present invention, at the bottom portion of the first aperture, a portion may exist where the source electrode portion, the drain electrode portion, and the liquid-philic layer portion do not exist and thus, where the insulating layer of the first thin film transistor element is in direct contact with the semiconductor layer of the first thin film transistor element, the portion being within an area of the bottom portion located in the direction of the second aperture, and at the bottom portion of the second aperture, a portion may exist where the source electrode portion, the drain electrode portion, and the liquid-philic layer portion do not exist and thus, where the insulating layer of the second thin film transistor element is in direct contact with the semiconductor layer of the second thin film transistor element, the portion being within an area of the bottom portion located in the direction of the first aperture. According to this structure, when semiconductor ink is applied with respect to the first and second apertures, a portion having greatest height of the surface of the semiconductor ink applied with respect to the first aperture is biased in the direction opposite the second aperture with higher certainty, and a portion having greatest height of the surface of the semiconductor ink applied with respect to the second aperture is biased in the direction opposite the first aperture with higher certainty. Such a state of the semiconductor ink applied with respect to the first and second apertures is realized by the relative difference between the liquid repellency of the insulating layer and the liquid repellency of the liquid-philic layer. As such, the semiconductor ink applied with respect to the first aperture and the semiconductor ink applied with respect to the second aperture are prevented from meeting and blending with each other with higher certainty.

In the thin film transistor device pertaining to one aspect of the present invention, at the bottom portion of the first aperture, the portion where the source electrode portion, the drain electrode portion, and the liquid-philic layer portion do not exist and thus, where the insulating layer of the first thin film transistor element is in direct contact with the semiconductor layer of the first thin film transistor element, may also exist within an area of the bottom portion located in the direction opposite the direction of the second aperture, and in plan view, the portion may occupy a greater area at the area of the bottom portion located in the direction of the second aperture than at the area of the bottom portion located in the direction opposite the direction of the second aperture, and at the bottom portion of the second aperture, the portion where the source electrode portion, the drain electrode portion, and the liquid-philic layer portion do not exist and thus, where the insulating layer of the second thin film transistor element is in direct contact with the semiconductor layer of the second thin film transistor element, may also exist within an area of the bottom portion located in the direction opposite the direction of the first aperture, and in plan view, the portion may occupy a greater area at the area of the bottom portion located in the direction of the first aperture than at the area of the bottom portion located in the direction opposite the direction of the first aperture.

When defining, at the bottom portion of each of the first and second apertures, an area of the portion where the insulating layer is in direct contact with the semiconductor layer, the above-described state where the portion having greatest height of the surface of the semiconductor ink applied with respect to the first aperture is biased in the direction opposite the second aperture, and the portion having greatest height of the surface of the semiconductor ink applied with respect to the second aperture is biased in the direction opposite the first aperture is realized with higher certainty. As such, the semiconductor ink applied with respect to the first aperture and the semiconductor ink applied with respect to the second aperture are prevented from meeting and blending with each other with higher certainty.

In the thin film transistor device pertaining to one aspect of the present invention, in each of the first and second thin film transistor elements, the liquid-philic layer may be formed by using a same material as used for forming the source electrode and the drain electrode, and the liquid-philic layer may be located apart from each of the source electrode and the drain electrode. When forming the liquid-philic layer in each of the first and second thin film transistor elements by using the same material used for forming the source electrode and the drain electrode as in the above-described structure, an increase in procedures during manufacture is prevented since the liquid-philic layer can be formed in the same procedure for forming the source electrode and the drain electrode. Due to this, an increase in manufacturing cost is prevented. Further, by disposing the liquid-philic layer such that, at the bottom portion of each of the first and second apertures, the liquid-philic layer portion is located apart from each of the source electrode portion and the drain electrode portion, the performance of the thin film transistor device can be maintained at a high level.

In the thin film transistor device pertaining to one aspect of the present invention, in plan view of the bottom portion of the first and second apertures, at the bottom portion of each of the first and second apertures, a center of area of each of the source electrode portion and the drain electrode portion may coincide with the center of area of the bottom portion. When disposing, at the bottom portion of each of the first and second apertures, the source electrode portion and the drain electrode portion so as to be in such an arrangement as described above, the semiconductor ink applied with respect to each of the apertures can be controlled such that the surface of the semiconductor ink exhibits the above-described state. As such, the semiconductor ink applied with respect to the first aperture and the semiconductor ink applied with respect to the second aperture are prevented from meeting and blending with each other.

In the thin film transistor device pertaining to one aspect of the present invention, in plan view of the bottom portion of the first aperture, a center of a total of areas of the source electrode portion, the drain electrode portion, and the liquid-philic layer portion may be offset from the center of area of the bottom portion in the direction opposite the direction of the second aperture, and in plan view of the bottom portion of the second aperture, a center of a total of areas of the source electrode portion, the drain electrode portion, and the liquid-philic layer portion may be offset from the center of area of the bottom portion in the direction opposite the direction of the first aperture. According to this structure, when semiconductor ink is applied with respect to each of the first and second apertures during the manufacture of the thin film transistor device, the surface of the semiconductor ink applied with respect to the first aperture is biased in the direction opposite the direction of the second aperture, and the surface of the semiconductor ink applied with respect to the second aperture is biased in the direction opposite the direction of the first aperture. This is due to the relationship between the liquid repellency of the insulating layer and the liquid repellency of the liquid-philic layer, the source electrode, and the drain electrode.

As such, the semiconductor ink applied with respect to the first aperture and the semiconductor ink applied with respect to the second aperture are prevented from meeting and blending with each other.

Note that, when denoting: the area of the source electrode portion as $A_S$; a distance from a given point to the center of area of the source electrode portion as $x_S$; the area of the drain electrode portion as $A_D$; a distance from the given point to the center of area of the drain electrode portion as $x_D$, the area of the liquid-philic layer portion as $A_H$; and a distance from the given point to the center of area of the liquid-philic layer portion as $x_H$, "a center of a total of areas of the source electrode portion, the drain electrode portion, and the liquid-philic layer portion", denoted as z, can be expressed as shown in Math. 1.

$$z=(A_S \times x_S + A_D \times x_D + A_H \times x_H)/(A_S + A_D + A_H) \quad \text{[Math. 1]}$$

In the thin film transistor device pertaining to one aspect of the present invention, at the bottom portion of the first aperture, a side of the liquid-philic layer portion located in the direction opposite the direction of the second aperture may be in contact with a side surface portion, of the partition walls, facing the first aperture, and at the bottom portion of the second aperture, a side of the liquid-philic layer portion located in the direction opposite the direction of the first aperture may be in contact with a side surface portion, of the partition walls, facing the second aperture. The above-described effect can also be realized by specifically arranging, in each of the first and second apertures, the liquid-philic layer portion as described above.

In the thin film transistor device pertaining to one aspect of the present invention, a liquid repellency of the surfaces of the partition walls may be greater than a liquid repellency of a surface of the insulating layer, in each of the first and second thin film transistor elements, that is in contact with the semiconductor layer, and the liquid repellency of the surface of the insulating layer, in each of the first and second thin film transistor elements, that is in contact with the semiconductor layer may be greater than a liquid repellency of a surface of each of the source electrode, the drain electrode, and the liquid-philic layer in each of the first and second thin film transistor elements. According to this structure, when semiconductor ink is applied with respect to the first and second apertures, a portion having greatest height of the surface of the semiconductor ink applied with respect to the first aperture is biased in the direction opposite the second aperture with even higher certainty, and a portion having greatest height of the surface of the semiconductor ink applied with respect to the second aperture is biased in the direction opposite the first aperture with even higher certainty. As such, the semiconductor ink applied with respect to the first aperture and the semiconductor ink applied with respect to the second aperture are prevented from meeting and blending with each other with certainty.

One aspect of the present invention is an organic EL display element comprising: the thin film transistor device pertaining to one aspect of the present invention; a planarizing film formed above the thin film transistor device and having a contact hole formed therein; a lower electrode formed on the planarizing film so as to cover the planarizing film and a side surface of the planarizing film defining the contact hole, and electrically connected with one of the source electrode and the drain electrode in the first thin film transistor element; an upper electrode formed above the lower electrode; and an organic light-emitting layer interposed between the lower electrode and the upper electrode.

According to such a structure, the organic EL display element pertaining to one aspect of the present invention realizes, as is, the above-described effect that is realized by any of the thin film transistor devices described above. As such, the organic EL display element pertaining to one aspect of the present invention has high quality.

One aspect of the present invention is an organic EL display device comprising the organic EL display element pertaining to one aspect of the present invention. According to this, the organic EL display device pertaining to one aspect of the present invention is also ensured to have high display quality, and at the same time, to have high yield in the manufacture thereof.

One aspect of the present invention is a method of manufacturing a thin film transistor device comprising:
  forming a first gate electrode and a second gate electrode on a substrate so as to be adjacent to each other with a gap therebetween;
  forming an insulating layer so as to cover the first gate electrode and the second gate electrode;
  forming first and second source electrodes, first and second drain electrodes, and first and second liquid-philic layers on the insulating layer, wherein (i) the first source electrode and the first drain electrode are formed with respect to the first gate electrode with a gap therebetween, (ii) the second source electrode and the second drain electrode are formed with respect to the second gate electrode with a gap therebetween, (iii) the first liquid-philic layer is formed with respect to the first source electrode and the first drain electrode so as to be located apart from the first source electrode and the first drain electrode, the first liquid-philic layer having higher liquid philicity than the insulating layer, and (iv) the second liquid-philic layer is formed with respect to the second source electrode and the second drain electrode so as to be located apart from the second source electrode and the second drain electrode, the second liquid-philic layer having higher liquid philicity than the insulating layer;
  depositing a layer of photosensitive resist material such that, above the insulating layer, the layer of photosensitive resist material covers the first and second source electrodes and the first and second drain electrodes;
  forming partition walls on the insulating layer by performing mask exposure and patterning of the layer of photosensitive resist material, the partition walls having liquid-repellant surfaces and defining a first aperture and a second aperture that is adjacent to the first aperture, the first aperture surrounding at least a part of each of the first source electrode, the first drain electrode, and the first liquid-philic layer, the second aperture surrounding at least a part of each of the second source electrode, the second drain electrode, and the second liquid-philic layer; and
  forming a first semiconductor layer with respect to the first aperture and a second semiconductor layer with respect to the second aperture by applying semiconductor material with respect to the corresponding aperture and drying the semiconductor material so applied, wherein (i) the first semiconductor layer is formed so as to be in contact with the first source electrode and the first drain electrode, and (ii) the second semiconductor layer is formed so as to be in contact with the second source electrode and the second drain electrode.

In the method of manufacturing a thin film transistor device pertaining to one aspect of the present invention, the partition walls are formed such that a bottom portion of each of the first and second apertures includes a source electrode portion being a bottom portion of the corresponding source electrode, a drain electrode portion being a bottom portion of the corresponding drain electrode, and a liquid-philic layer portion being a bottom portion of the corresponding liquid-philic layer, in plan view of the bottom portion of the first aperture, a center of area of the liquid-philic layer portion is offset from a center of area of the bottom portion in a direction opposite a direction of the second aperture, and in plan view of the bottom portion of the second aperture, a center of area of the liquid-philic layer portion is offset from a center of area of the bottom portion in a direction opposite a direction of the first aperture.

According to the method of manufacturing a thin film transistor device pertaining to one aspect of the present invention, the partition walls are formed such that, at the bottom portion of the first aperture, the liquid-philic layer portion is disposed at a side opposite from a side located in the direction of the second aperture, and at the bottom portion of the second aperture, the liquid-philic layer portion is disposed at a side opposite from a side located in the direction of the first aperture. Due to this, when the application (dropping) of semiconductor material (semiconductor ink) with respect to the first and second apertures is performed in the forming of the first and second semiconductor layers, a portion having greatest height of the surface of the semiconductor ink applied with respect to the first aperture is biased in the direction opposite the second aperture with certainty, and a portion having greatest height of the surface of the semiconductor ink applied with respect to the second aperture is biased in the direction opposite the first aperture with certainty. As such, the semiconductor ink applied with respect to the first aperture and the semiconductor ink applied with respect to the second aperture are prevented from meeting and blending with each other.

Accordingly, by preventing semiconductor ink applied with respect to the first aperture and semiconductor ink applied with respect to the second aperture from meeting and blending each other with certainty, a thin film transistor device having high quality can be manufactured.

In the method of manufacturing a thin film transistor device pertaining to one aspect of the present invention, the partition walls may be formed such that at the bottom portion of the first aperture, a portion exists where the source electrode portion, the drain electrode portion, and the liquid-philic layer portion do not exist and thus, where the insulating layer is to come in direct contact with the first semiconductor layer, the portion being within an area of the bottom portion located in the direction of the second aperture, and at the bottom portion of the second aperture, a portion exists where the source electrode portion, the drain electrode portion, and the liquid-philic layer portion do not exist and thus, where the insulating layer is to come in direct contact with the second semiconductor layer, the portion being within an area of the bottom portion located in the direction of the first aperture. According to this method, when semiconductor ink is applied with respect to the first and second apertures, a portion having greatest height of the surface of the semiconductor ink applied with respect to the first aperture is biased in the direction opposite the second aperture with higher certainty, and a portion having greatest height of the surface of the semiconductor ink applied with respect to the second aperture is biased in the direction opposite the first aperture with higher certainty. Such a state of the semiconductor ink applied with respect to the first and second apertures is realized by the relative difference between the liquid repellency of the insulating layer and the liquid repellency of the liquid-philic layer. As such, the semiconductor ink applied with respect to the first aperture and the semiconductor ink applied with respect to the second aperture are prevented from meeting and blending with each other with higher certainty.

In the method of manufacturing a thin film transistor device pertaining to one aspect of the present invention, the partition walls may be formed such that at the bottom portion of the first aperture, the portion where the source electrode portion, the drain electrode portion, and the liquid-philic layer portion do not exist and thus, where the insulating layer is to come in direct contact with the first semiconductor layer, also exists within an area of the bottom portion located in the direction opposite the direction of the second aperture, and in plan view, the portion occupies a greater area at the area of the bottom portion located in the direction of the second aperture than at the area of the bottom portion located in the direction opposite the direction of the second aperture, and at the bottom portion of the second aperture, the portion where the source electrode portion, the drain electrode portion, and the liquid-philic layer portion do not exist and thus, where the insulating layer is to come in direct contact with the second semiconductor layer, also exists within an area of the bottom portion located in the direction opposite the direction of the first aperture, and in plan view, the portion occupies a greater area at the area of the bottom portion located in the direction of the first aperture than at the area of the bottom portion located in the direction opposite the direction of the first aperture.

According to this method where the area occupied by the portion where the insulating layer and the semiconductor layer are to come into direct contact in each of the bottom portions of the first and second aperture is defined as described above, a portion having greatest height of the surface of the semiconductor ink applied with respect to the first aperture is biased in the direction opposite the second aperture with even higher certainty, and a portion having greatest height of the surface of the semiconductor ink applied with respect to the second aperture is biased in the direction opposite the first aperture with even higher certainty. As such, the semiconductor ink applied with respect to the first aperture and the semiconductor ink applied with respect to the second aperture are prevented from meeting and blending with each other with higher certainty.

In the method of manufacturing a thin film transistor device pertaining to one aspect of the present invention, the forming, on the insulating layer, of the first and second source electrodes, the first and second drain electrodes, and the first and second liquid-philic layers may include sub-steps of: forming a metal layer on the insulating layer; and etching the metal layer so formed. By forming the liquid-philic layer by using the same material used for forming the source electrode and the drain electrode as in the above-described method, an increase in procedures during manufacture is prevented, and hence, the above-described effect can be realized while preventing an increase in manufacturing cost.

In the method of manufacturing a thin film transistor device pertaining to one aspect of the present invention, the forming of the insulating layer, the forming of the first and second source electrodes, the first and second drain electrodes, and the first and second liquid-philic layers, the forming of the partition walls, and the forming of the first and second semiconductor layers may be performed such that a liquid repellency of the surfaces of the partition walls is greater than a liquid repellency of a surface of the insulating layer that is to come in contact with the first and second semiconductor layers, and the liquid repellency of the surface of the insulating layer is greater than a liquid repellency of a surface of each of the first and second source electrodes, each of the first and second drain electrodes, and each of the first and second liquid-philic layers. By controlling the liquid repellency of each of the elements as described above, semiconductor ink applied with respect to the first aperture and semiconductor ink applied with respect to the second aperture are prevented from meeting and blending with each other with even higher certainty. As such, a thin film transistor device having high quality can be manufactured with certainty.

Note that in the above, when a given element is "on" or "above" another element, the given element is not limited to being disposed in the absolutely vertical direction with respect to the other element. Instead, in the present disclosure, the terms "on" and "above" are used to indicate the relative positions of different elements, or more specifically, the relative positions of different elements along the direction in which such elements are layered. Further, in the present disclosure, the term "on" or "above" are each used to indicate not only one but both of a state where a gap exists between two elements and a state where the two elements are in close contact with each other.

In the following, explanation is provided of characteristics of various forms of implementation and the effects achieved thereby, with reference to several specific examples thereof. Further, note that although the following embodiments include description on fundamental characteristic features, the present disclosure is not to be construed as being limited to the description provided in the following embodiments other than such fundamental features.

[Embodiment 1]

1. Overall Structure of Organic EL Display Device 1

In the following, description is provided on a structure of an organic EL display device 1 pertaining to embodiment 1 of the present disclosure, with reference to FIG. 1.

As illustrated in FIG. 1, the organic EL display device 1 includes an organic EL display panel 10 and a drive control circuit portion 20 connected to the organic EL display panel 10.

The organic EL display panel 10 is a panel that makes use of electroluminescence of organic material. The organic EL display panel 10 is composed of a plurality of organic EL elements that are, for instance, arranged so as to form a matrix. The drive control circuit portion 20 includes four drive circuits, namely drive circuits 21 through 24, and a control circuit 25.

Note that, in the organic EL display device 1 pertaining to the present embodiment, the positional arrangement of the drive control circuit portion 20 with respect to the organic EL display panel 10 is not limited to that illustrated in FIG. 1.

2. Structure of Organic EL Display Panel 10

In the following, description is provided on a structure of the organic EL display panel 10, with reference to the schematic cross-sectional view of FIG. 2, and FIGS. 3A and 3B.

Figure 2:
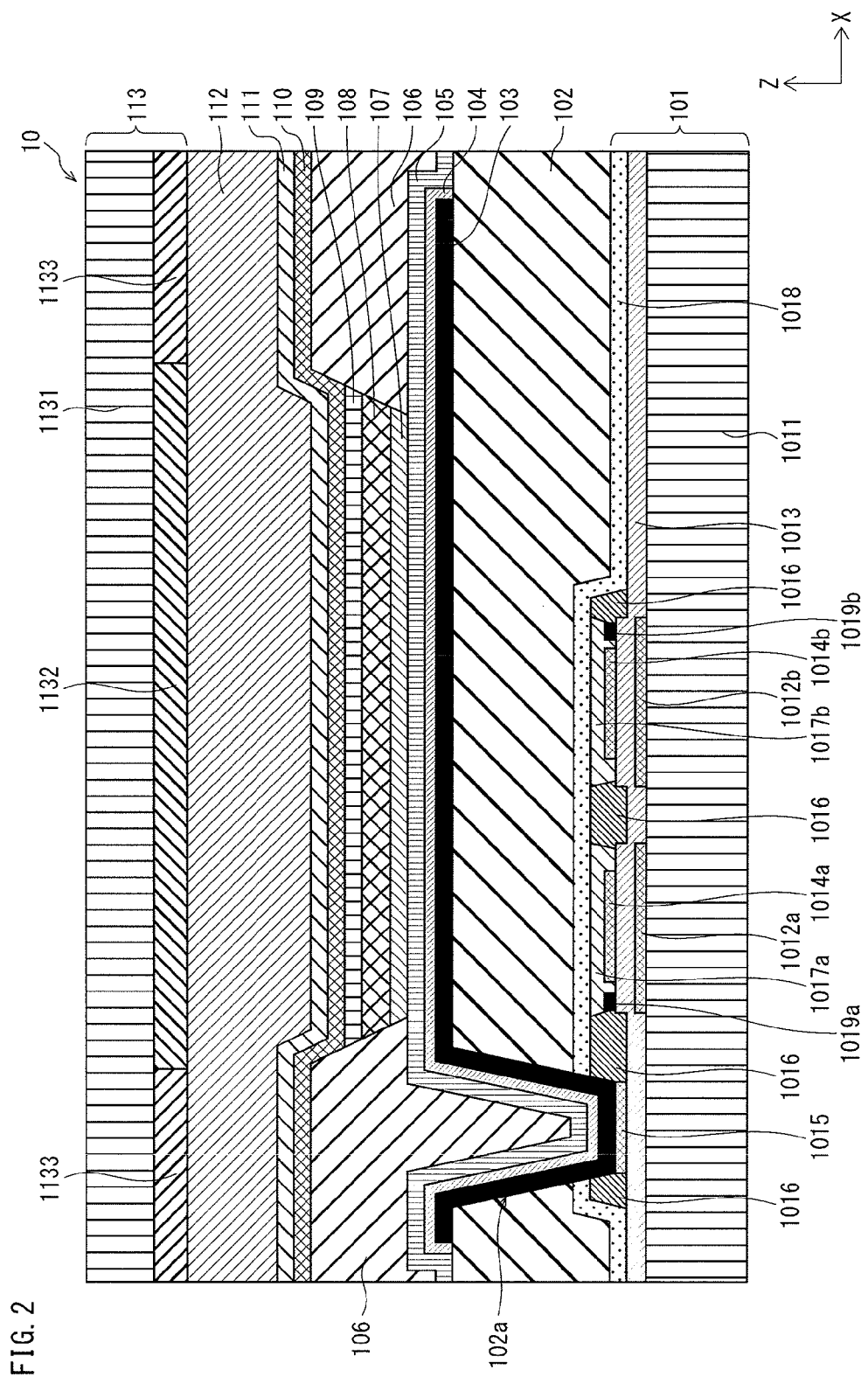
FIG. 2 is a schematic cross-sectional view illustrating a partial structure of an organic EL display panel 10.

As illustrated in FIG. 2, the organic EL display panel 10 includes a thin film transistor (TFT) substrate 101. The TFT substrate 101 has a structure where gate electrodes 1012a, 1012b are layered on a substrate 1011 with a gap between one another, and an insulating layer 1013 is layered so as to cover the substrate 1011 and the gate electrodes 1012a, 1012b. On the insulating layer 1013, source electrodes 1014a, 1014b, respectively corresponding to the gate electrodes 1012a, 1012b are disposed. Further, as illustrated in FIG. 3A, drain electrodes 1014c, 1014d are disposed on the insulating layer 1013. The drain electrodes 1014c, 1014d respectively correspond to the source electrodes 1014a, 1014b, and are each disposed so as to be located apart from a corresponding one of the source electrodes 1014a, 1014b in the Y axis direction with a gap therebetween.

Further, as illustrated in FIG. 3A, a liquid-philic layer 1019a, corresponding to the source electrode 1014a and the drain electrode 1014c, is formed on the insulating layer 1013. Similarly, a liquid-philic layer 1019b, corresponding to the source electrode 1014b and the drain electrode 1014d, is formed on the insulating layer 1013.

In addition, as illustrated in FIG. 2 and FIG. 3A, a connection wire 1015 is disposed on the insulating layer 1013 at the left side of the source electrode 1014a in the X axis direction, and such that there is a gap between the connection wire 1015 and the source electrode 1014a. The connection wire 1015 is formed by extending the source electrode 1014a or the drain electrode 1014c. Alternatively, the connection wire 1015 is electrically connected to the source electrode 1014a or the drain electrode 1014c.

Further, as illustrated in FIGS. 2 and 3A, partition walls 1016 are disposed on the insulating layer 1013. The partition walls 1016 surround (a) the connection wire 1015, (b) a combination of the source electrode 1014a, the drain electrode 1014c, and the liquid-philic layer 1019a, and (c) a combination of the source electrode 1014b, the drain electrode 1014d, and the liquid-philic layer 1019b, in such a manner that (a), (b), and (c) are separated from one another by being surrounded by the partition walls 1016. In other words, as illustrated in FIG. 3A, the partition walls 1016 define three apertures, namely an aperture 1016a, an aperture 1016b, and an aperture 1016c. The aperture 1016a at the far left side in the X axis direction has a bottom portion where the connection wire 1015 remains exposed. The aperture 1016a is not a channel portion and functions as a contact portion that contacts an anode. On the other hand, the aperture 1016b has a bottom portion where the source electrode 1014a, the drain electrode 1014c, and the liquid-philic layer 1019a remain exposed, and the aperture 1016c has a bottom portion where the source electrode 1014b, the drain electrode 1014d, and the liquid-philic layer 1019b remain exposed. The apertures 1016b and 1016c function as channel portions.

Here, note that as illustrated in FIG. 3A, at the bottom portion of the aperture 1016b, the source electrode 1014a and the drain electrode 1014c are disposed such that a center of area of each of the source electrode 1014a and the drain electrode 1014c coincides with a center of area (center $L_1$) of the bottom portion of the aperture 1016b in the X axis direction. Similarly, at the bottom portion of the aperture 1016c, the source electrode 1014b and the drain electrode 1014d are disposed such that a center of area of each of the source electrode 1014b and the drain electrode 1014d coincides with a center of area (center $L_2$) of the bottom portion of the aperture 1016c in the X axis direction.

On the other hand, at the bottom portion of the aperture 1016b, the liquid-philic layer 1019a is disposed such that a center of area of the liquid-philic layer 1019a is offset from the center of area (center $L_1$) of the bottom portion in the X axis direction in the left direction along the X axis, which is opposite the direction of the adjacent aperture 1016c. Further, at the bottom portion of the aperture 1016c, the liquid-philic layer 1019b is disposed such that a center of area of the liquid-philic layer 1019b is offset from the center of area (center $L_2$) of the bottom portion in the X axis direction in the right direction along the X axis, which is opposite the direction of the adjacent aperture 1016b.

Returning to FIG. 2, within the aperture 1016b defined by the partition walls 1016, an organic semiconductor layer 1017a is disposed on the source electrode 1014a and the drain electrode 1014c included therein. Similarly, within the aperture 1016c defined by the partition walls 1016, an organic semiconductor layer 1017b is disposed on the source electrode 1014b and the drain electrode 1014d. More specifically, the organic semiconductor layer 1017a is formed so as to cover the source electrode 1014a and the drain electrode 1014c and also fill a gap between the source electrode 1014a and the drain electrode 1014c. The organic semiconductor layer 1017a so formed is in contact with the source electrode 1014a and the drain electrode 1014c. The organic semiconductor layer 1017b is formed in a similar manner and is in contact with the source electrode 1014b and the drain electrode 1014d. Further, the organic semiconductor layer 1017a and the organic semiconductor layer 1017b are partitioned from each other by the partition walls 1016.

Here, note that within the aperture 1016b, the organic semiconductor layer 1017a is in direct contact with the insulating layer 1013 at an exposed portion 1013a illustrated in FIG. 3B, without the source electrode 1014a or the drain electrode 1014c existing therebetween. Similarly, within the aperture 1016c, the organic semiconductor layer 1017b is in direct contact with the insulating layer 1013 at an exposed portion 1013b illustrated in FIG. 3B, without the source electrode 1014b or the drain electrode 1014d existing therebetween. Also refer to FIG. 2 for illustration of the above.

Further, as illustrated in FIG. 2, a passivation film 1018 is disposed so as to cover the organic semiconductor layer 1017a, the organic semiconductor layer 1017b, and the insulating layer 1013. However, it should be noted that the passivation film 1018 is not disposed above the area corresponding to the connection wire 1015, and therefore, an opening is formed at such an area.

The TFT substrate 101 of the organic EL display panel 10 pertaining to the present embodiment has a structure as described up to this point.

In the following, the entire structure of the organic EL display panel 10, including the TFT substrate 101, is explained. As illustrated in FIG. 2, a planarizing film 102 covers the TFT substrate 101 from above. However, it should be noted that the planarizing film 102 does not cover the connection wire 1015, and a contact hole 102a is formed in the planarizing film 102 at an area above the connection wire 1015. The contact hole 102a is in communication with the aperture 1016a of the TFT substrate 101.

An anode 103, a light-transmissive conduction film 104, and a hole injection layer 105 are disposed in the stated order on a main surface of the planarizing film 102. Here, each of the anode 103, the light-transmissive conduction film 104, and the hole injection layer 105 is disposed not only on the planarizing film 102 but also along a side surface of the planarizing film 102 defining the contact hole 102a. The anode 103 is in contact with and electrically connected to the connection wire 1015.

Further, banks 106 are disposed on the hole injection layer 105. The banks 106 are disposed so as to surround an area above the hole injection layer 105 that corresponds to a light-emitting portion (i.e., a subpixel). In an opening formed at the above-described area by the banks 106, a hole transport layer 107, an organic light-emitting layer 108, and an electron transport layer 109 are disposed in the stated order.

On the electron transport layer 109 and on exposed surfaces of the banks 106, a cathode 110 and a sealing layer 111 are disposed in the stated order so as to cover the electron transport layer 109 and the exposed surfaces of the banks 106. Further, a color filter (CF) substrate 113 is arranged so as to face the sealing layer 111. The sealing layer 111 and the CF substrate 113 are joined together by an adhesion layer 112 filling a gap therebetween. The CF substrate 113 includes a substrate 1131, and a color filter 1132 and a black matrix 1133 disposed on a main surface of the substrate 1131. The main surface of the substrate 1131 is a surface of the substrate 1131 that is located lower in the Z axis direction.

3. Material Constituting Organic EL Display Panel 10

Each part of the organic EL display panel 10 may, for instance, be formed by using the materials as described in the following.

(i) Substrate 1011

The substrate 1011 may be, for instance: a glass substrate; a quartz substrate; a silicon substrate; a metal substrate composed of, for example, molybdenum sulfide, copper, zinc, aluminum, stainless steel, magnesium, iron, nickel, gold, or silver; a semiconductor substrate composed of, for example, gallium arsenide; or a plastic substrate.

Examples of material constituting the plastic substrate include thermoplastic resins and thermosetting resins. Examples thereof include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be a single layer substrate composed of one of the materials described above or a multilayer substrate having layers composed of two or more materials.

(ii) Gate Electrodes 1012a, 1012b

The gate electrodes 1012a, 1012b may be made of, for instance, any material having electrical conductivity.

Specific examples thereof include metals, such as chromium, aluminum, tantalum, molybdenum, niobium, copper, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing conductive particles, such as fine metal particles and graphite, may be used. These materials may be used alone or in combination.

(iii) Insulating Layer 1013

The insulating layer 1013 functions as a gate insulating layer. The insulating layer 1013 may be made, for instance, of any material having insulative properties. Examples of the material that can be used include organic insulating materials and inorganic insulating materials.

Examples of organic insulating materials include acrylic resins, phenolic resins, fluororesins, epoxy resins, imide resins, and novolac type resins.

Examples of inorganic insulating materials include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, the insulating layer 1013 may have a surface thereof processed by using a surface treatment agent (ODTS OTS HMDS βPTS) or the like.

(iv) Source Electrodes 1014a, 1014b, and Drain Electrodes 1014c, 1014d

The source electrodes 1014a, 1014b and the drain electrodes 1014c, 1014d can be formed by using the same materials as used for forming the gate electrodes 1012a, 1012b.

(v) Organic Semiconductor Layers 1017a, 1017b

The organic semiconductor layers 1017a, 1017b may be formed by using, for instance, any material that has semiconducting properties and is soluble to a solvent. Specific examples thereof include thiophene-based materials, such as poly(3-alkylthiophene), poly(3-hexylthiophene) (P3HT), poly(3-octylthiophene), poly(2,5-thienylene vinylene) (PTV), quarterthiophene (4T), sexithiophene (6T), octathiophene, 2,5-bis(5'-biphenyl-2'-thienyl)thiophene (BPT3), 2,5-[2,2'-(5,5'-diphenyl)dithienyl]thiophene, and [5,5'-bis(3-dodecyl-2-thienyl)-2,2'-bithiophene] (PQT-12); phenylene vinylene-based materials such as poly(paraphenylene vinylene) (PPV); fluorene-based materials such as poly(9,9-dioctylfluorene) (PFO); triallylamine-based polymers; acene-based materials, such as anthracene, tetracene, pentacene, and hexacene; benzene-based materials, such as 1,3,5-tris[(3-phenyl-6-trifluoromethyl)quinoxalin-2-yl]benzene (TPQ1) and 1,3,5-tris[{3-(4-tert-butylphenyl)-6- trisfluoromethyl}quinoxalin-2-yl]benzene (TPQ2); phthalocyanine-based materials, such as phthalocyanine, copper phthalocyanine (CuPc), iron phthalocyanine, and perfluorophthalocyanine; organometallic materials, such as tris(8-hydroxyquinoline) aluminum (Alq3) and fac-tris(2-phenylpyridine) iridium (Ir(ppy)$_3$); C60; polymers, such as, oxadiazole-based polymers, triazole-based polymers, carbazole-based polymers, and fluorene-based polymers; poly(9,9-dioctylfluorene-co-bis-N,N'-(4-methoxyphenyl)-bis-N,N'-phenyl-1,4-phenylenediamine) (PFMO); poly(9,9-dioctylfluorene-co-benzothiadiazole) (BT); fluorene-triallylamine copolymers; and copolymers of fluorene and poly(9,9-dioctylfluorene-co-dithiophene) (F8T2). These materials may be alone or in combination.

Alternatively, the organic semiconductor layers 1017a, 1017b may be formed by using an inorganic material that is soluble in a solvent.

(v) Passivation Film 1018

The passivation film 1018 may be formed by using, for instance, a water soluble resin such as polyvinyl alcohol (PVA), or a fluororesin.

(vii) Planarizing Film 102

The planarizing film 102 is formed by using, for instance, an organic compound such as polyimide, polyamide, and acrylic resin material.

(viii) Anode 103

The anode 103 is made of a metal material containing silver (Ag) or aluminum (Al). Further, in a top-emission type display panel such as the organic EL display panel 10 pertaining to the present embodiment, it is desirable that a surface portion of the anode 103 have high reflectivity.

(ix) Light-transmissive Conduction Film 104

The light-transmissive conduction film 104 is formed by using, for instance, Indium Tin Oxide (ITO), Indium Zinc Oxide (IZO), or the like.

(x) Hole Injection Layer 105

The hole injection layer 105 is a layer made of, for instance, an oxide of a metal such as silver (Ag), molybdenum (Mo), chromium (Cr), vanadium (V), tungsten (W), nickel (Ni), and iridium (Ir), or a conductive polymer material such as PEDOT (an amalgam of polythiophene and polystyrene sulfonic acid). The hole injection layer 105 in the organic EL display panel 10 pertaining to the present embodiment as illustrated in FIG. 2 is assumed to be made of a metal oxide. In such a case, the hole injection layer 105 is provided with a function of assisting hole generation and injecting holes into the organic light-emitting layer 108 with a higher level of stability, compared to when the hole injection layer 105 is made of a conductive polymer material such as PEDOT. As such, the hole injection layer 105, when made of a metal oxide, has a higher work function than the hole injection layer 105, when made of a conductive polymer material.

Here, a case where the hole injection layer 105 is made of an oxide of a transition metal is considered. In such a case, a plurality of levels can be occupied since there are a plurality of oxidation numbers. This makes hole injection easy and allows for reduction of driving voltage. It is particularly desirable to form the hole injection layer 105 by using tungsten oxide (WO$_x$) since the hole injection layer 105 can be provided with the function of stably injecting holes and assisting the generation of holes.

(xi) Banks 106

The banks 106 are formed by using an organic material such as resin and have insulative properties. Example of organic material usable for forming the banks 106 include acrylic resins, polyimide resins, and novolac type phenolic resin. In addition, it is desirable that the banks 106 have organic solvent resistance. Further, since the banks 106 may undergo processes such as etching, baking, etc. when being formed, it is desirable that the banks 106 be formed from highly resistant material that will not change excessively in shape or quality during such processes. In addition, to provide the banks 106 with liquid repellency, the surfaces thereof can be fluoridated.

This is since, if a liquid-philic material is used to form the banks 106, the difference in liquid philicity/liquid repellency between the surfaces of the banks 106 and the surface of organic light-emitting layer 108 becomes small, and it thus becomes difficult to keep ink including an organic substance for forming the organic light-emitting layer 108 to be selectively held within the apertures defined by the banks 106.

In addition, the banks 106 need not be formed so as to have a single-layer structure as shown in FIG. 2. That is, the banks 106 may be alternatively formed so as to have a structure including two or more layers. In such a case, the above materials may be combined for each layer, or layers may alternate between inorganic and organic material.

(xii) Hole Transport Layer 107

The hole transport layer 107 is formed by using a high-molecular compound not containing a hydrophilic group. For instance, the hole transport layer 107 may be formed by using a high-molecular compound such as polyfluorene or a derivative thereof, and polyallylamine or a derivative thereof, but not containing a hydrophilic group.

(xiii) Organic Light-Emitting Layer 108

The organic light-emitting layer 108 has a function of emitting light when an excitation state is produced by the recombination of holes and electrons injected thereto. It is desirable that material used to form the organic light-emitting layer 108 is a light emitting-organic material, a film of which can be formed by wet printing.

Specifically, it is desirable that the organic light-emitting layer 108 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(xiv) Electron Transport Layer 109

The electron transport layer 110 has a function of transporting electrons injected through the cathode 111 to the organic light-emitting layer 108, and is formed by using, for instance, an oxadiazole derivative (OXD), a triazole derivative (TAZ), a phenanthroline derivative (BCP, Bphen), or the like.

(xv) Cathode 110

The cathode 110 is formed by using, for instance, Indium Tin Oxide (ITO), Indium Zinc Oxide (IZO), or the like. Further, in a top-emission type display panel such as the organic EL display panel 10 pertaining to the present embodiment, it is desirable that the cathode 110 be formed by using light-transmissive material. When forming the cathode 111 by using light-transmissive material as described above, it is desirable that the cathode 111 be provided with light-transmissivity of 80% or greater.

In addition to the materials presented above, the following materials may be used to form the cathode 110. That is, the cathode 110 may be formed, for instance, as a layer including an alkali metal, a layer including an alkali earth metal, or a layer including an alkali earth metal halide. Alternatively, the cathode 110 may be formed as a laminate including one of the above-described layers and a layer including Ag laminated in the stated order. When the cathode 110 is formed as a laminate as described above, the layer including Ag may be formed with Ag alone, or with an alloy of Ag. Further, in order to enhance the efficiency with which light is guided out from the organic EL display panel 10, a highly light-transmissive, refraction index adjustment layer may be provided above the layer including Ag.

(xvi) Sealing Layer 111

The sealing layer 111 has a function of preventing organic layers such as the organic light-emitting layer 108 from being exposed to water and/or air and is formed by using, for example, material such as silicon nitride (SiN) and silicon oxynitride (SiON). In addition, a sealing resin layer made of a resin material such as acrylic resin and silicone resin may be further disposed above the sealing layer, which is formed by using material such as silicon nitride (SiN) and silicon oxynitride (SiON) as described above.

Further, in a top-emission type display panel such as the organic EL display panel 10 pertaining to the present embodiment, it is desirable that the sealing layer 111 be formed by using light-transmissive material.

4. Arrangement of Source Electrodes 1014a, 1014b, Drain Electrodes 1014c, 1014d, and Liquid-Philic Layers 1019a, 1019b in TFT Substrate 101

In the following, description is provided on a positional arrangement of the source electrodes 1014a, 1014b, the drain electrodes 1014c, 1014d, and the liquid-philic layers 1019a, 1019b in the TFT substrate 101, with reference to FIGS. 3A and 3B.

As illustrated in FIGS. 3A and 3B, at the bottom portion of the aperture 1016b defined by the partition walls 1016, the source electrode 1014a and the drain electrode 1014c are arranged such that centers, in the X axis direction, of the source electrode 1014a and the drain electrode 1014c coincide with the center of area (center $L_1$) of the bottom portion of the aperture 1016b in the X axis direction. Similarly, at the bottom portion of the aperture 1016c defined by the partition walls 1016, the source electrode 1014b and the drain electrode 1014d are arranged such that centers, in the X axis direction, of the source electrode 1014b and the drain electrode 1014d coincide with the center of area (center $L_2$) of the bottom portion of the aperture 1016b in the X axis direction. Further, at the bottom portion of the aperture 1016b, both sides in the X axis direction of each of the source electrode 1014a and the drain electrode 1014c are located apart from a side surface portion, of the partition walls 1016, facing the aperture 1016b, and similarly, at the bottom portion of the aperture 1016c, both sides in the X axis direction of each of the source electrode 1014b and the drain electrode 1014d are located apart from the side surface portion, of the partition walls 1016, facing the aperture 1016c.

Further, as illustrated in FIG. 3A, at the bottom portion of the aperture 1016b, the liquid-philic layer 1019a is arranged to be located apart from (i.e., offset from) the center of area (center $L_1$) of the bottom portion in the X axis direction, and at the bottom portion of the aperture 1016c, the liquid-philic layer 1019b is arranged to be located apart from (i.e., offset from) the center of area (center $L_2$) of the bottom portion in the X axis direction. More specifically, at the bottom portion of the aperture 1016b, the liquid-philic layer 1019a is offset in the left direction along the X axis with respect to the center $L_1$, and similarly, at the bottom portion of the aperture 1016c, the liquid-philic layer 1019b is offset in the right direction along the X axis with respect to the center $L_2$.

As illustrated in FIG. 3B, the liquid-philic layer 1019a is located apart from each of the source electrode 1014a and the drain electrode 1014c, and is disposed so as to be in contact with the side surface portion, of the partition walls 1016, facing the aperture 1016b. Similarly, as illustrated in FIG. 3B, the liquid-philic layer 1019b is located apart from each of the source electrode 1014b and the drain electrode 1014d, and is disposed so as to be in contact with the side surface portion, of the partition walls 1016, facing the aperture 1016c.

Thus, at the bottom portion of the aperture 1016b, a center of a total of areas of the source electrode 1014a, the drain electrode 1014c, and the liquid-philic layer 1019a is offset in the left direction along the X axis from the center of area (center $L_1$) of the bottom portion in the X axis direction. Similarly, at the bottom portion of the aperture 1016c, a center of a total of areas of the source electrode 1014b, the drain electrode 1014d, and the liquid-philic layer 1019b is offset in the right direction along the X axis from the center of area (center $L_2$) of the bottom portion in the X axis direction.

Note that each of "a center of a total of areas of the source electrode 1014a, the drain electrode 1014c, and the liquid-philic layer 1019a" and "a center of a total of areas of the source electrode 1014b, the drain electrode 1014d, and the liquid-philic layer 1019b" as mentioned above can be calculated according to Math. 1 above.

In addition, as illustrated in FIGS. 3A and 3B, at a point when the organic semiconductor layer 1017a has not yet been formed, at the bottom portion of the aperture 1016b, the portion of the insulating layer 1013 remaining exposed (i.e., the exposed portion 1013a) occupies a greater area in the right side of the bottom portion of the aperture 1016b in the X axis direction compared to in the left side. Similarly, at a point when the organic semiconductor layer 1017b has not yet been formed, at the bottom portion of the aperture 1016c, the portion of the insulating layer 1013 remaining exposed (i.e., the exposed portion 1013b) occupies a greater area in the left side of the bottom portion of the aperture 1016c in the X axis direction compared to in the right side.

5. Method of Manufacturing Organic Display Device 1

(i) Overview of Method of Manufacturing Organic EL Display Panel 10

In the following, description is provided on a method of manufacturing the organic EL display device 1, and in particular, a method of manufacturing the organic EL display panel 10, with reference to FIG. 2 and FIGS. 4A and 4B.

First, as illustrated in FIG. 2 and FIG. 4A, the substrate 1011 is prepared (Step S1). The substrate 1011 serves as a base of the TFT substrate 101. Then, the TFT substrate 101 is formed by forming a thin film transistor (TFT) element on the substrate 1011 (Step S2).

Then, as illustrated in FIG. 2 and FIG. 4A, the planarizing film 102, which is made of insulative material, is formed on the TFT substrate 101 (Step S3). As illustrated in FIG. 2, the planarizing film 102 has the contact hole 102a formed therein at an area above the connection wire 1015 in the TFT substrate 101. Further, the planarizing film 102 is formed such that upper surfaces in the Z axis direction of portions thereof other than the contact hole 102a are substantially planar.

Then, the anode 103 is formed on the planarizing film 102 (Step S4). As illustrated in FIG. 2, the anode 103 in the organic EL display panel 10 is formed so as to be partitioned in units of light emission (i.e., in units of subpixels). Further, the anode 103 is formed so as to have a portion that is connected to the connection wire 1015 of the TFT substrate 101 by being formed along the side surface of the planarizing film 102 defining the contact hole 102a.

Here, note that the anode 103 can be formed, for instance, by first forming a metal film according to the sputtering method, the vacuum vapor deposition method, or the like, and then etching the metal film so formed to obtain subpixel units.

Then, the light-transmissive conduction film 104 is formed so as to cover an upper surface of the anode 103 (Step S5). As illustrated in FIG. 2, the light-transmissive conduction film 104 covers not only the upper surface of the anode 103 but also surfaces of lateral edges of the anode 103. Further, the light-transmissive conduction film 104 also covers the upper surface of the anode 103 within the contact hole 102a. Note that the light-transmissive conduction film 104 can also be formed, for instance, by first forming a film according to the sputtering method, the vacuum vapor deposition method, or the like, and then etching the film so formed to obtain subpixel units.

Then, the hole injection layer 105 is formed on the light-transmissive conduction film 104 (Step S6). Note that, although the hole injection layer 105 is formed so as to cover the entire light-transmissive conduction film 104 in FIG. 2, the hole injection layer 105 may alternatively be formed so as to be partitioned into subpixel units.

Further, when forming the hole injection layer 105 by using a metal oxide (e.g., tungsten oxide), the formation of the metal oxide film can be performed according to specific film forming conditions. For instance, the metal oxide film can be formed under film forming conditions such that: (i) a gas including argon gas and oxygen gas is used as a sputtering gas in a chamber of a sputtering device for forming the metal oxide film; (ii) a total pressure of the sputtering gas is higher than 2.7 Pa and lower than or equal to 7.0 Pa; (iii) a partial pressure of the oxygen gas in the sputtering gas is at least 50% and at most 70%; and (iv) an input power density per unit area of the sputtering target is at least 1.0 W/cm$^2$ and at most 2.8 W/cm$^2$.

Then, the banks 106 defining subpixels of the organic EL display panel 10 are formed (Step S7). As illustrated in FIG. 2, the banks 106 are formed so as to be layered onto the hole injection layer 105.

In specific, the banks 106 are formed by first forming a layer of material for forming the banks 106 (hereinafter referred to as a "material layer") on the hole injection layer 105. The material layer is formed, for instance, by using a material including a photosensitive resin component and a fluorine component such as acrylic resin, polyimide resin, and novolac-type phenolic resin, and according to the spin coating method, or the like. Note that, in the present embodiment, a negative photosensitive material manufactured by Zeon Corporation (product code: ZPN 1168), which is one example of a photosensitive resin material, can be used for forming the material layer. Subsequently, by patterning the material layer so formed, apertures corresponding to the subpixels of the organic EL display panel 10 are formed. The forming of the apertures can be performed by disposing a mask onto the surface of the material layer, performing exposure from over the mask, and finally performing developing.

Then, in each concavity on the hole injection layer 105 defined by the banks 106, the hole transport layer 107, the organic light-emitting layer 108, and the electron transport layer 109 are formed in the stated order so as to be layered one on top of another (Steps S8 through S10).

The hole transport layer 107 is formed by first forming, according to the printing method, a film made of an organic compound for forming the hole transport layer 107, and then sintering the film so formed. The organic light-emitting layer 108 is similarly formed by first forming a film according to the printing method, and then sintering the film so formed.

Then, the cathode 110 and the sealing layer 111 are layered onto the electron transport layer 109 in the stated order (Steps S11 and S12). As illustrated in FIG. 2, the cathode 110 and the sealing layer 111 are formed so as to cover the layers therebelow entirely, including top surfaces of the banks 106.

Then, an adhesive resin material for forming the adhesion layer 112 is applied onto the sealing layer 111, and a color filter (CF) panel having been prepared in advance is adhered onto the sealing layer 111 via the adhesive layer 112 (Step S13). As illustrated in FIG. 2, the CF substrate 113 adhered onto the sealing layer 111 via the adhesion layer 112 includes the substrate 1131, and the color filter 1132 and the black matrix 1133 formed on the surface of the substrate 1131 that is located lower in the Z axis direction.

As such, the manufacturing of the organic EL display panel 10, which is an organic EL display element, is completed.

Note that, although illustration is not provided in the drawings, the manufacturing of the organic EL display device 1 is completed by annexing the drive control circuit portion 20 to the organic EL display panel 10 (refer to FIG. 1), and then performing aging processing. The aging processing is performed by, for instance, causing the organic EL display device 1 to conduct until the mobility of holes in the organic EL display device 1 reaches 1/10 or lower with respect to the hole injection characteristics before the aging processing. More specifically, in the aging processing, the organic EL display device 1 is electrified for a predetermined time period while maintaining the luminous intensity of the organic EL display device 1 to be at least equal to the luminous intensity upon actual usage and at most three times the luminous intensity upon actual usage.

(ii) Method of Forming TFT Substrate 101

Subsequently, description is provided on a method of forming the TFT substrate 101, with reference to FIG. 4B, FIGS. 5A through 5C, FIGS. 6A through 6C, FIGS. 7A through 7C, and FIGS. 8A and 8B.

As illustrated in FIG. 5A, the gate electrodes 1012a, 1012b are formed on a main surface of the substrate 1011 (Step S21 in FIG. 4B). Note that the formation of the gate electrodes 1012a, 1012b may be performed according to the above-described method applied in the formation of the anode 103.

Then, as illustrated in FIG. 5B, the insulating layer 1013 is formed so as to cover the substrate 1011 and the gate electrodes 1012a, 1012b (Step S22 in FIG. 4B). Then, as illustrated in FIG. 5C, the source electrodes 1014a, 1014b, the drain electrodes 1014c, 1014d, the connection wire 1015, and the liquid-philic layers 1019a, 1019b are formed on a main surface of the insulating layer 1013 (Step S23 in FIG. 4B). In this step, note that the position of each of the liquid-philic layers 1019a, 1019b with respect to the corresponding one of the source electrodes 1014a, 1014b and the corresponding one of the drain electrodes 1014c, 1014d, is defined such that (i) the relative position of the liquid-philic layer 1019a with respect to the source electrode 1014a and the drain electrode 1014c, and (ii) the relative position of the liquid-philic layer 1019b with respect to the source electrode 1014b and the drain electrode 1014d are in accordance with the positional relationships described above (refer to FIGS. 3A and 3B). Such arrangements are made in the present step taking into account the partition walls 1016 that are formed through the following steps.

Further, due to the source electrodes 1014a, 1014b, the drain electrodes 1014c, 1014d, and the liquid-philic layers 1019a, 1019b being formed as described above, the exposed portion 1013a of the insulating layer 1013 is formed at the right side of the source electrode 1014a and the drain electrode 1014c in the X axis direction, and the exposed portion 1013b of the insulating layer 1013 is formed at the left side of the source electrode 1014b and the drain electrode 1014d in the X axis direction.

Here, note that the forming, on the insulating layer 1013, of the source electrodes 1014a, 1014b, the drain electrodes 1014c, 1014d, the connection wire 1015, and the liquid-philic layers 1019a, 1019b can be performed by first executing a substep of forming a metal layer covering the insulating layer 1013 entirely, and then, by executing a substep of etching and thereby dividing the metal layer into the source electrodes 1014a, 1014b, the drain electrodes 1014c, 1014d, the connection wire 1015, and the liquid-philic layers 1019a, 1019b. That is, in the present embodiment, the source electrodes 1014a, 1014b, the drain electrodes 1014c, 1014d, and the liquid-philic layers 1019a, 1019b are formed by using the same material.

Then, as illustrated in FIG. 6A, a film 10160 of photoresist material for forming the partition walls 1016 is deposited so as to accumulate and cover the source electrodes 1014a, 1014b, the drain electrodes 1014c, 1014d, the connection wire 1015, the liquid-philic layers 1019a, 1019b, and the exposed portions 1013a, 1013b of the insulating layer 1013 (Step S24 in FIG. 4B).

Then, as illustrated in FIG. 6B, a mask 501 is disposed above the film 10160 so deposited, and mask exposure and patterning of the photoresist material film 10160 is performed (Step S25 in FIG. 4B). Here, note that the mask 501 has window portions 501a, 501b, 501c, and 501d formed therein which correspond in position to the partition walls 1016 to be formed. Note that, although not illustrated in FIG. 6B, the mask 501 has additional window portions formed therein which also correspond in position to the partition walls 1016 to be formed.

The partition walls 1016, illustration of which is provided in FIG. 6C, are formed in such a manner as described above (Step S26 in FIG. 4B). The partition walls 1016 define a plurality of apertures including the apertures 1016a, 1016b, and 1016c. At the bottom portion of the aperture 1016a, the partition walls 1016 defining the aperture 1016a surround the connection wire 1015. At the bottom portion of the aperture 1016b, the partition walls 1016 defining the aperture 1016b surround the source electrode 1014a, the drain electrode 1014c (undepicted in FIG. 6C), and the liquid-philic layer 1019a. At the bottom portion of the aperture 1016c, the partition walls 1016 defining the aperture 1016c surround the source electrode 1014b, the drain electrode 1014d (undepicted in FIG. 6C), and the liquid-philic layer 1019b. In each of the apertures 1016b, 1016c, the corresponding one of the liquid-philic layers 1019a, 1019b is located apart from the corresponding one of the source electrodes 1014a, 1014b and the corresponding one of the drain electrodes 1014c, 1014d (undepicted in FIG. 6C). Further, as illustrated in FIG. 6C, one end portion of each of the liquid-philic layers 1019a, 1019b is in contact with the side surface portion of the partition walls 1016 facing the corresponding one of the apertures 1016b, 1016c.

Figure 7:
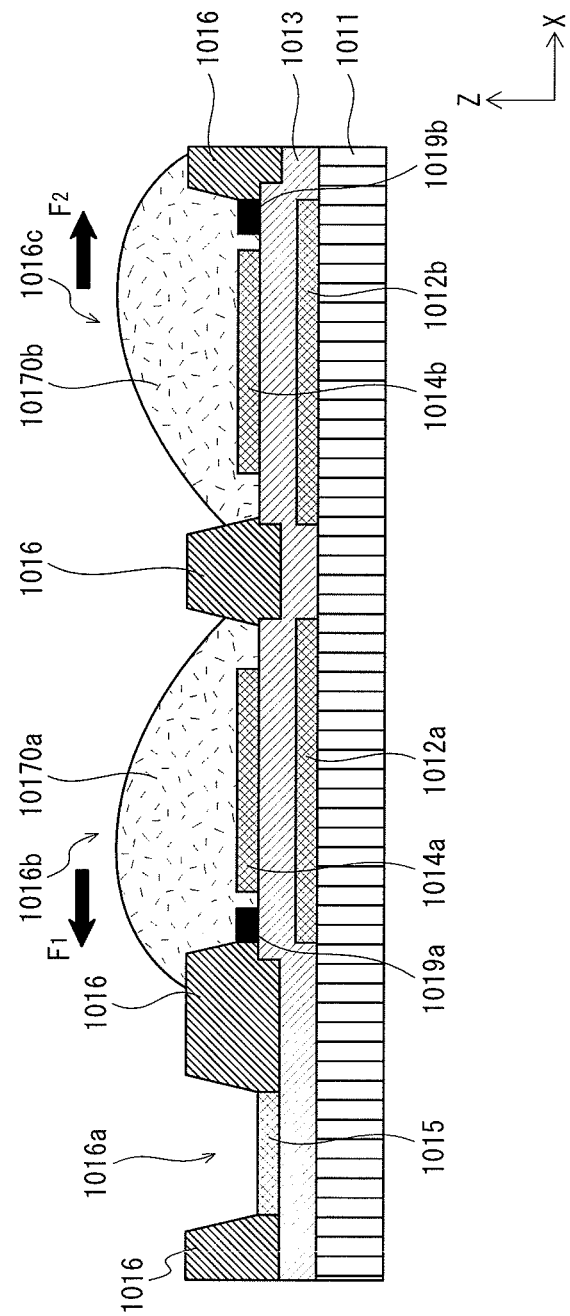
FIG. 7 is a schematic process diagram illustrating a procedure among procedures involved in the manufacturing of the TFT substrate 101.

After the partition walls 1016 are formed, organic semiconductor ink 10170a, 10170b, for respectively forming the organic semiconductor layers 1017a, 1017b, are respectively applied to the apertures 1016b, 1016c defined by the partition walls 1016, as illustrated in FIG. 7 (Step S27 in FIG. 4B). Here, it should be noted that the surface shape of the organic semiconductor ink 10170a applied with respect to the aperture 1016b is not symmetrical in the X axis direction. Rather, the surface shape of the organic semiconductor ink 10170a is biased in the left direction along the X axis (the direction indicated by the arrow $F_1$ above the organic semiconductor ink 10170a in FIG. 7). On the other hand, the surface shape of the organic semiconductor ink 10170b applied with respect to the aperture 1016c is biased in the right direction along the X axis (the direction indicated by the arrow $F_2$ above the organic semiconductor ink 10170b in FIG. 7). In other words, a portion of the surface of the organic semiconductor ink 10170a having the greatest height is offset from the center of area (center $L_1$) of the aperture 1016b in a direction opposite the direction of the aperture 1016c, and a portion of the surface of the organic semiconductor ink 10170b having the greatest height is offset from the center of area (center $L_2$) of the aperture 1016c in a direction opposite the direction of the aperture 1016c, and thus are distant from each other.

The above-described is effect is achieved due to the liquid-philic layers 1019a, 1019b being formed in the apertures 1016b, 1016c.

By controlling the surface shapes of the organic semiconductor ink 10170a, 10170b in such a manner, the organic semiconductor ink 10170a, 10170b is prevented from meeting and blending with each other. The specific reasons as to why such a problem can be prevented are described later in the present disclosure.

Figure 8A:
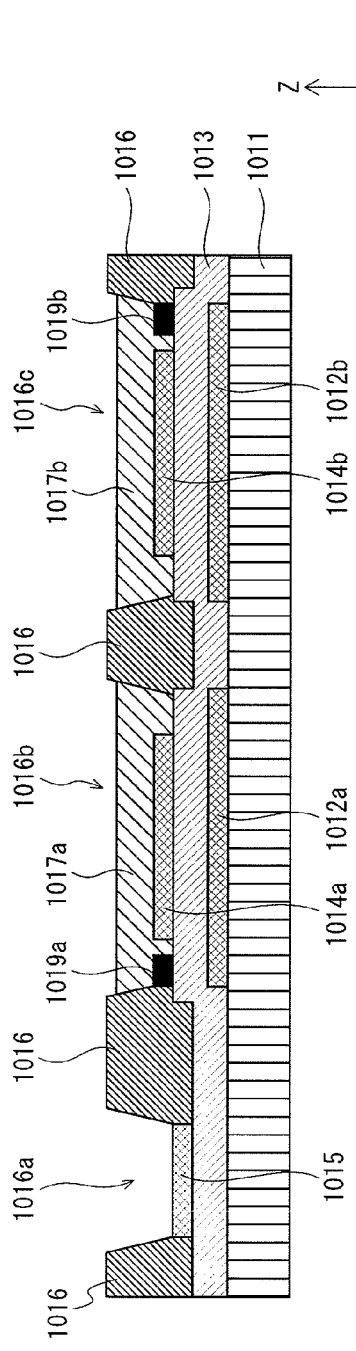
FIGS. 8A and 8B are schematic process diagrams illustrating some procedures among procedures involved in the manufacturing of the TFT substrate 101.

Subsequently, by drying the organic semiconductor ink 10170a, 10170b (Step S28 in FIG. 4B), the organic semiconductor layers 1017a, 1017b are respectively formed with respect to the apertures 1016b, 1016c as illustrated in FIG. 8A (Step S29 in FIG. 4B).

Figure 8B:
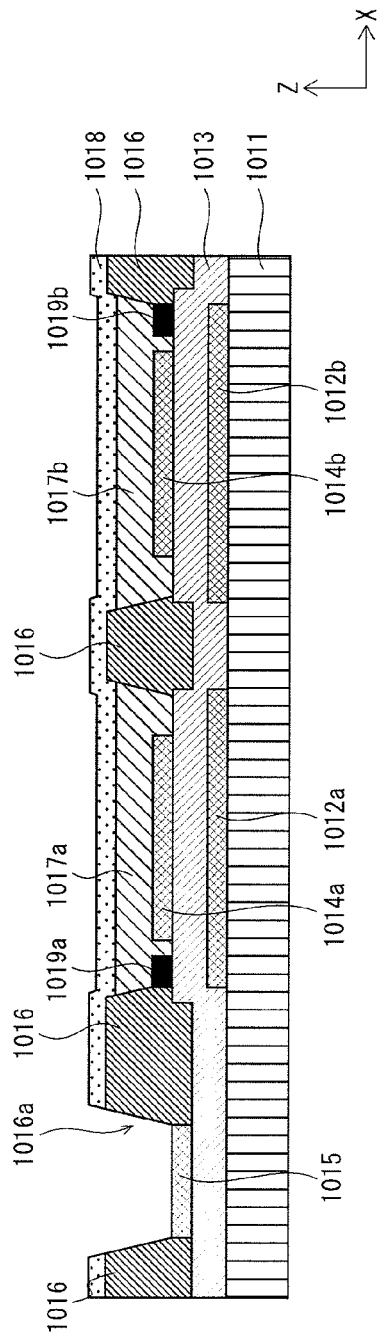

Finally, the formation of the TFT substrate 101 is completed by forming the passivation film 1018 so as to entirely cover underlayers therebelow with the exception of a contact area including the aperture 1016a, etc., as illustrated in FIG. 8B (Step S30 in FIG. 4B).

6. Effects Achieved

For the reasons explained in the following, the TFT substrate 101 pertaining to the present embodiment, the organic EL display panel 10 including the TFT substrate 101, and the organic EL display device 1 having a structure including the organic EL display panel 10 are ensured to have high quality, and at the same time, to have high yield in the manufacture thereof.

As illustrated in FIG. 7, according to the TFT substrate 101 pertaining to the present embodiment, when the organic semiconductor ink 10170a, 10170b, which are for respectively forming the organic semiconductor layers 1017a, 1017b, are respectively applied (dropped) with respect to the apertures 1016b, 1016c, the surface shape of each of the organic semiconductor ink 10170a, 10170b is such that, the height of the surface thereof is greater at one side of the corresponding one of the apertures 1016b, 1016c that is opposite the side of the partition walls 1016 between the apertures 1016b and 1016c. Due to this, in the manufacture of the TFT substrate 101 pertaining to the present embodiment, the organic semiconductor ink 10170a dropped with respect to the aperture 1016b and the organic semiconductor ink 10170b dropped with respect to the aperture 1016c can be prevented from meeting and blending with certainty.

As such, according to the TFT substrate 101 pertaining to the present embodiment, the organic semiconductor layer 1017a corresponding to the aperture 1016b and the organic semiconductor layer 1017b corresponding to the aperture 1016c can be formed with high accuracy and as planned beforehand. In addition, in the TFT substrate 101 pertaining to the present embodiment, the layer thickness of each of the organic semiconductor layers 1017a and 1017b can be controlled with high precision.

As such, the TFT substrate 101 pertaining to the present embodiment, the organic EL display panel 10 including the TFT substrate 101, and the organic EL display device 1 having a structure including the organic EL display panel 10 have high quality since, upon formation of the organic semiconductor layers 1017a, 1017b in the TFT substrate 101, the organic semiconductor ink 10170a, 10170b is prevented from meeting and blending with each other.

Note that the above-described effect is a result of (i) the liquid-philic layers 1019a, 1019b being disposed at the bottom portions of the apertures 1016b, 1016c, (ii) the above-described relationship between the total of area of the liquid-philic layer 1019a, the source electrode 1014a, and the drain electrode 1014c and the center of area of the bottom portion of the aperture 1016b, and the above-described relationship between the total of area of the liquid-philic layer 1019b, the source electrode 1014b, and the drain electrode 1014d and the center of area of the bottom portion of the aperture 1016c, and (iii) a specific relationship between the liquid repellency of the surfaces of the partition walls 1016, the liquid repellency of the surface of the insulating layer 1013, and the liquid repellency of the surfaces of the source electrodes 1014a, 1014b, the drain electrodes 1014c, 1014d, and the liquid-philic layers 1019a, 1019b.

Concerning (iii) above, in specific, the following relationship is satisfied when denoting: the liquid repellency of the surfaces of the partition walls 1016 as $R_W$; the liquid repellency of the surface of the insulating layer 1013 as $R_I$; and the liquid repellency of the surfaces of the source electrodes 1014a, 1014b, the drain electrodes 1014c, 1014d, and the liquid-philic layers 1019a, 1019b as $R_E$.

$$R_W > R_I > R_E \quad \text{[Math. 2]}$$

Note that, the liquid repellency denoted by each of $R_W$, $R_I$, and $R_E$ indicates the liquid repellency of the corresponding surface(s) with respect to the organic semiconductor ink 10170a, 10170b.

In the meantime, when seen from an opposite point of view, or that is, in terms of wettability, the characteristics of the surfaces of the partition walls 1016, the characteristics of the surface of the insulating layer 1013, and the characteristics of the surfaces of the source electrodes 1014a, 1014b, the drain electrodes 1014c, 1014d, and the liquid-philic layers 1019a, 1019b satisfy the following relationship.

$$W_W < W_I < W_E \quad \text{[Math. 3]}$$

In Math. 3, $W_W$ denotes the wettability of the surfaces of the partition walls 1016, $W_I$ denotes the wettability of the surface of the insulating layer 1013, and $W_E$ denotes the wettability of the surfaces of the source electrodes 1014a, 1014b, the drain electrodes 1014c, 1014d, and the liquid-philic layers 1019a, 1019b.

As described up to this point, according to the present embodiment, control is performed of (i) the disposal of the liquid-philic layers 1019a, 1019b at the bottom portions of the apertures 1016b, 1016c, (ii) the positional arrangement of the source electrodes 1014a, 1014b, the drain electrodes 1014c, 1014d, and the liquid-philic layers 1019a, 1019b at the bottom portions of the apertures 1016b, 1016, and (iii) the relationship between the liquid repellency of the surfaces of the partition walls 1016, the liquid repellency of the surface of the insulating layer 1013, and the liquid repellency of the surfaces of the source electrodes 1014a, 1014b, the drain electrodes 1014c, 1014d, and the liquid-philic layers 1019a, 1019b. Due to this, the surfaces of the organic semiconductor ink 10170a, 10170b, upon application in the manufacturing of the TFT substrate 101, exhibit the shapes as illustrated in FIG. 7. Hence, the organic semiconductor ink 10170a dropped with respect to the aperture 1016b and the organic semiconductor ink 10170b dropped with respect to the aperture 1016c are effectively prevented from meeting and blending with each other. This results in the organic semiconductor layer 1017a and the organic semiconductor layer 1017b being separately formed as planned beforehand, which further results in prevention of mixing of components between the organic semiconductor layer 1017a and the organic semiconductor layer 1017b and changes in layer thicknesses of the organic semiconductor layer 1017a and the organic semiconductor layer 1017b. As such, the TFT substrate 101, the organic EL display panel 10, and the organic EL display device 1 are ensured to have high quality, and at the same time, to have high yield in the manufacture thereof.

Note that, as illustrated in FIGS. 3A and 3B, the exposed portions 1013a, 1013b of the insulating layer 1013 are formed at the bottom portions of the apertures 1016b, 1016c. Further, at the bottom portion of the aperture 1016b, the area of the portion of the insulating layer 1013 remaining exposed (i.e., the area of the exposed portion 1013a) is greater in the right side of the bottom portion in the X axis direction compared to in the left side. Similarly, at the bottom portion of the aperture 1016c, the area of the portion of the insulating layer 1013 remaining exposed (i.e., the area of the exposed portion 1013b) is greater in the left side of the bottom portion in the X axis direction compared to in the right side. Such a relationship is also effective in achieving the above-described effects.

[Embodiment 2]

Figure 9A:
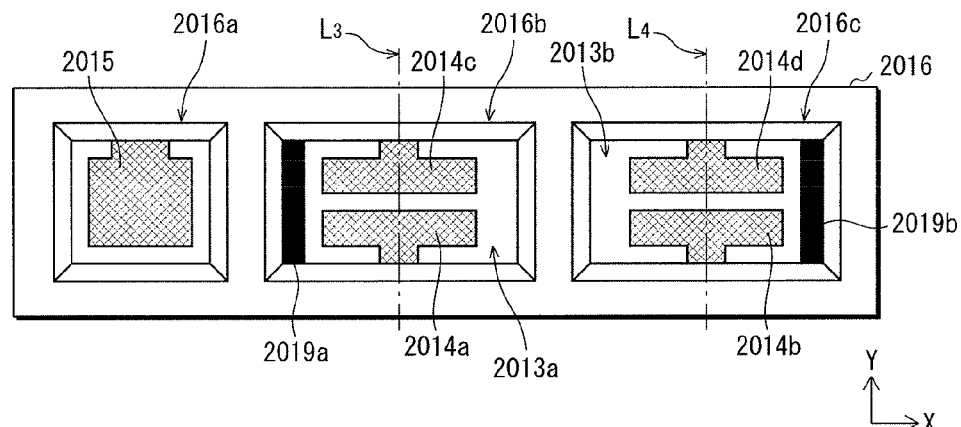
FIG. 9A is a schematic plan view illustrating, in a structure of an organic EL display panel pertaining to embodiment 2, a partial structure of a TFT substrate.

In the following, description is provided on a structure of a TFT substrate pertaining to embodiment 2 of the present disclosure, with reference to FIG. 9A. FIG. 9A corresponds to FIG. 3A in embodiment 1, and other than differences between the structures illustrated in FIG. 9A and FIG. 3A, embodiment 2 is similar to embodiment 1. As such, the structures similar between embodiment 2 and embodiment 1 are not illustrated in the drawings nor will be described in the following.

As illustrated in FIG. 9A, the TFT substrate pertaining to the present embodiment has partition walls 2016 that define three apertures, namely apertures 2016a, 2016b, 2016c. At the bottom portion of the aperture 2016b, a source electrode 2014a and a drain electrode 2014c are disposed. Similarly, at the bottom portion of the aperture 2016c, a source electrode 2014b, and a drain electrode 2014d are disposed. In addition, at the bottom portion of the aperture 2016b, a liquid-philic layer 2019a is disposed, and at the bottom portion of the aperture 2016c, the liquid-philic layer 2019b is disposed. Similar as in embodiment 1, the liquid-philic layers 2019a, 2019b are formed by using the same material as used for forming the source electrodes 2014a, 2014b, and the drain electrodes 2014c, 2014d.

The source electrode 2014a and the drain electrode 2014c at the bottom portion of the aperture 2016b each have a T-shape in plan view. Similarly, the source electrode 2014b and the drain electrode 2014d at the bottom portion of the aperture 2016c each have a T-shape in plan view. Further, a portion of the source electrode 2014a extending in the X axis direction faces a portion of the drain electrode 2014c extending in the X axis direction, and similarly, a portion of the source electrode 2014b extending in the X axis direction faces a portion of the drain electrode 2014d extending in the X axis direction. Further, at the bottom portion of the aperture 2016b, a center of area of each of the source electrode 2014a and the drain electrode 2014c coincides with the center of area (center $L_3$) of the bottom portion in the X axis direction. In addition, at the bottom portion of the aperture 2016b, the liquid-philic layer 2019a is disposed such that a center of area of the liquid-philic layer 2019a is offset in the left direction along the X axis with respect to the center of area of the bottom portion.

Similarly, at the bottom portion of the aperture 2016c, a center of area of each of the source electrode 2014b and the drain electrode 2014d coincides with the center of area (center $L_4$) of the bottom portion in the X axis direction. In addition, at the bottom portion of the aperture 2016c, the liquid-philic layer 2019b is disposed such that a center of area of the liquid-philic layer 2019b is offset in the right direction along the X axis with respect to the center of area of the bottom portion.

In the TFT substrate pertaining to the present embodiment, at the bottom portion of the aperture 2016b, each of the source electrode 2014a and the drain electrode 2014c is located apart in the X axis direction from a side surface portion, of the partition walls 2016, facing the aperture 2016b, and similarly, at the bottom portion of the aperture 2016c, each of the source electrode 2014b and the drain electrode 2014d is located apart in the X axis direction from a side surface portion, of the partition walls 2016, facing the aperture 2016c. Further, at the bottom portion of the aperture 2016b, a left side of the liquid-philic layer 2019a in the X axis direction is in contact with the side surface portion, of the partition walls 2016, facing the aperture 2016b, and similarly, at the bottom portion of the aperture 2016c, a right side of the liquid-philic layer 2019b in the X axis direction is in contact with the side surface portion, of the partition walls 2016, facing the aperture 2016c.

In addition, at the bottom portion of the aperture 2016b before the formation of an organic semiconductor layer, an exposed portion 2013a of an insulating layer 2013 occupies a greater area in the right side of the bottom portion in the X axis direction compared to in the left side, as illustrated in FIG. 9A. Similarly, at the bottom portion of the aperture 2016c before the formation of an organic semiconductor layer, an exposed portion 2013b of the insulating layer 2013 occupies a greater area in the left side of the bottom portion in the X axis direction compared to in the right side, as illustrated in FIG. 9A.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

[Embodiment 3]

Figure 9B:
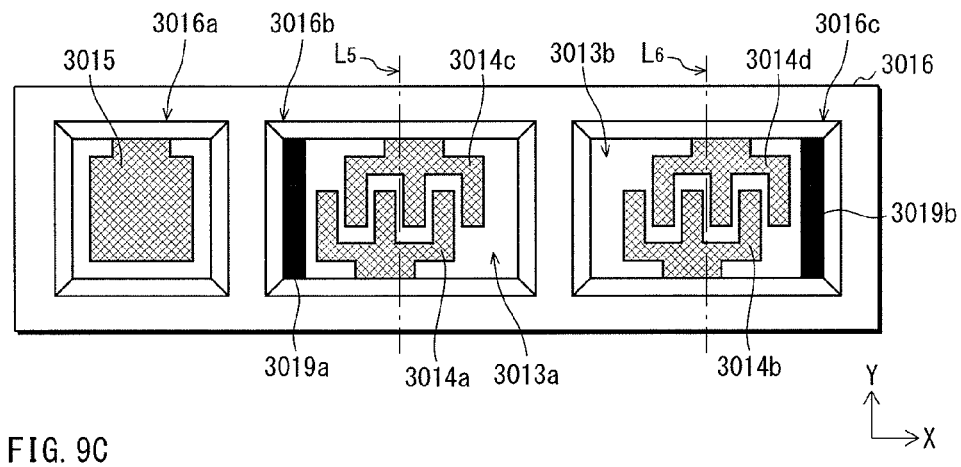
FIG. 9B is a schematic plan view illustrating, in a structure of an organic EL display panel pertaining to embodiment 3, a partial structure of a TFT substrate.

In the following, description is provided on a structure of a TFT substrate pertaining to embodiment 3 of the present disclosure, with reference to FIG. 9B. FIG. 9B corresponds to FIG. 3A in embodiment 1, and other than differences between the structures illustrated in FIG. 9B and FIG. 3A, embodiment 3 is similar to embodiments 1 and 2. As such, the structures similar between embodiment 3 and embodiments 1 and 2 are not illustrated in the drawings nor will be described in the following.

As illustrated in FIG. 9B, partition walls 3016 in the TFT substrate pertaining to the present embodiment also define three apertures, namely apertures 3016a, 3016b, 3016c. At a bottom portion of the aperture 3016b, a source electrode 3014a, a drain electrode 3014c, and a liquid-philic layer 3019a are disposed. At a bottom portion of the aperture 3016c, a source electrode 3014b, a drain electrode 3014d, and a liquid-philic layer 3019b are disposed. In the present embodiment, and similar as in the above-described embodiments, the liquid-philic layers 3019a, 3019b are formed by using the same material as used for forming the source electrodes 3014a, 3014b and the drain electrodes 3014c, 3014d.

The source electrode 3014a and the drain electrode 3014c at the bottom portion of the aperture 3016b each have a comb shape in plan view and each have a comb-teeth portion. Similarly, the source electrode 3014b and the drain electrode 3014d at the bottom portion of the aperture 3016c each have a comb shape in plan view and each have a comb-teeth portion. At the bottom portion of the aperture 3016b, the comb teeth portion of the source electrode 3014a faces the comb teeth portion of the drain electrode 3014c. Similarly, at the bottom portion of the aperture 3016c, the comb teeth portion of the source electrode 3014b faces the comb teeth portion of the drain electrode 3014d. Further, at the bottom portion of the aperture 3016b, a center of area of each of the source electrode 3014a and the drain electrode 3014c coincides with the center of area (center $L_5$) of the bottom portion in the X axis direction. In addition, at the bottom portion of the aperture 3016b, the liquid-philic layer 3019a is disposed such that a center of area of the liquid-philic layer 3019a is offset in the left direction along the X axis with respect to the center of area of the bottom portion.

Similarly, at the bottom portion of the aperture 3016c, a center of area of each of the source electrode 3014b and the drain electrode 3014d coincides with the center of area (center $L_6$) of the bottom portion in the X axis direction. In addition, at the bottom portion of the aperture 3016c, the liquid-philic layer 3019b is disposed such that a center of area of the liquid-philic layer 3019b is offset in the right direction along the X axis with respect to the center of area of the bottom portion.

Similar as in the above, in the TFT substrate pertaining to the present embodiment, at the bottom portion of the aperture 3016b, each of the source electrode 3014a and the drain electrode 3014c is located apart from both sides in the X axis direction (i.e., the right and left sides) of a side surface portion, of the partition walls 3016, facing the aperture 3016b, and similarly, at the bottom portion of the aperture 3016c, each of the source electrode 3014b and the drain electrode 3014d is located apart from both sides in the X axis direction (i.e., the right and left sides) of a side surface portion, of the partition walls 3016, facing the aperture 3016c. Further, at the bottom portion of the aperture 3016b, a left side of the liquid-philic layer 3019a in the X axis direction is in contact with the side surface portion, of the partition walls 3016, facing the aperture 3016b, and similarly, at the bottom portion of the aperture 3016c, a right side of the liquid-philic layer 3019b in the X axis direction is in contact with the side surface portion, of the partition walls 3016, facing the aperture 3016c.

In addition, at the bottom portion of the aperture 3016b before the formation of an organic semiconductor layer, an area of an insulating layer 3013 remaining exposed (i.e., an area of an exposed portion 3013a) is greater in the right side of the bottom portion in the X axis direction compared to in the left side, as illustrated in FIG. 9B. Similarly, at the bottom portion of the aperture 3016c before the formation of an organic semiconductor layer, an area of the insulating layer 3013 remaining exposed (i.e., an area of an exposed portion 3013b) is greater in the left side of the bottom portion in the X axis direction compared to in the right side, as illustrated in FIG. 9B.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In addition, according to the present embodiment, the source electrodes 3014a, 3014b and the drain electrodes 3014c, 3014d each have a comb shape, and further, the comb-teeth portion of the source electrode 3014a faces the comb-teeth portion of the drain electrode 3014c, and the comb-teeth portion of the source electrodes 3014b faces the comb-teeth portion of the drain electrode 3014d. As such, the areas of the electrodes facing the corresponding electrode increase, which leads to an improvement in transistor characteristics.

[Embodiment 4]

Figure 9C:
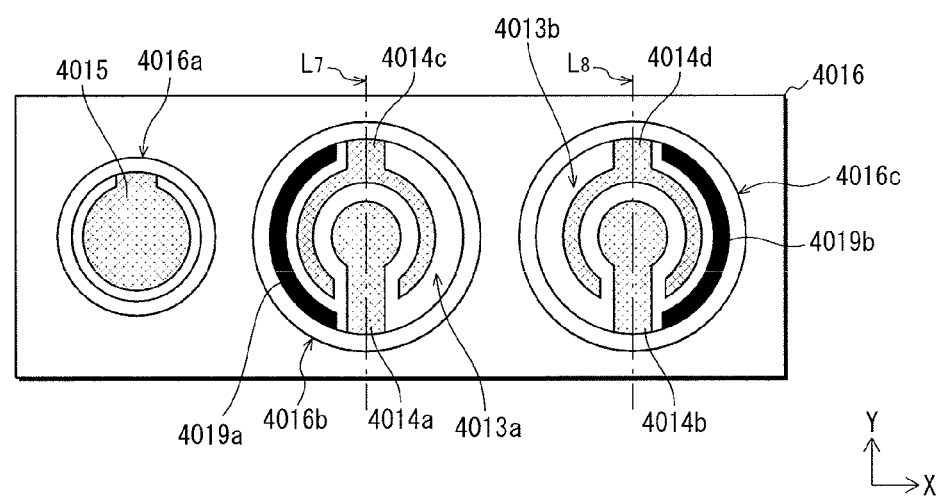
FIG. 9C is a schematic plan view illustrating, in a structure of an organic EL display panel pertaining to embodiment 4, a partial structure of a TFT substrate.

In the following, description is provided on a structure of a TFT substrate pertaining to embodiment 4 of the present disclosure, with reference to FIG. 9C. FIG. 9C corresponds to FIG. 3A in embodiment 1, and other than differences between the structures illustrated in FIG. 9C and FIG. 3A, embodiment 4 is similar to embodiments 1, 2, and 3. As such, the structures similar between embodiment 4 and embodiments 1, 2, and 3 are not illustrated in the drawings nor will be described in the following.

As illustrated in FIG. 9C, partition walls 4016 in the TFT substrate pertaining to the present embodiment define three apertures, namely apertures 4016a, 4016b, 4016c. Further, each of the apertures 4016a, 4016b, 4016c has an opening having a substantially circular shape, and each of the apertures 4016a, 4016b, 4016c has a bottom portion having a substantially circular shape. At the bottom portion of the aperture 4016b, a source electrode 4014a and a drain electrode 4014c each having an outline of a circular shape or a shape of a circular arc are disposed. Similarly, at the bottom portion of the aperture 4016c, a source electrode 4014b and a drain electrode 4014d each having an outline of a circular shape or a shape of a circular arc are disposed. Further, at the bottom portion of the aperture 4016b, a liquid-philic layer 4019a having a shape of a circular arc is disposed, and similarly, at the bottom portion of the aperture 4016c, a liquid-philic layer 4019b having a shape of a circular arc is disposed.

At the bottom portion of the aperture 4016b, a center of area of each of the source electrode 4014a and the drain electrode 4014c in the X axis direction coincides with a center of area (center $L_7$) of the bottom portion in the X axis direction. In addition, at the bottom portion of the aperture 4016b, the liquid-philic layer 4019a is disposed such that a center of area of the liquid-philic layer 4019a is offset in the left direction along the X axis with respect to the center of area of the bottom portion.

Similarly, at the bottom portion of the aperture 4016c, a center of area of each of the source electrode 4014b and the drain electrode 4014d in the X axis direction coincides with a center of area (center $L_8$) of the bottom portion in the X axis direction. In addition, at the bottom portion of the aperture 4016c, the liquid-philic layer 4019b is disposed such that a center of area of the liquid-philic layer 4019b is offset in the right direction along the X axis with respect to the center of area of the bottom portion.

Due to the positional arrangements described above, a center of a total of areas of the source electrode 4014a, the drain electrode 4014c, and the liquid-philic layer 4019a is offset in the left direction along the X axis from the center of area (center $L_7$) of the bottom portion of the aperture 4016b in the X axis direction. Similarly, a center of a total of areas of the source electrode 4014b, the drain electrode 4014d, and the liquid-philic layer 4019b is offset in the right direction along the X axis from the center of area (center $L_8$) of the bottom portion of the aperture 4016c in the X axis direction.

Similar as in the above, in the TFT substrate pertaining to the present embodiment, at the bottom portion of the aperture 4016b, each of the source electrode 4014a and the drain electrode 4014c is located apart from both sides in the X axis direction (i.e., the right and left sides) of a side surface portion, of the partition walls 4016, facing the aperture 4016b, and similarly, at the bottom portion of the aperture 4016c, each of the source electrode 4014b and the drain electrode 4014d is located apart from both sides in the X axis direction (i.e., the right and left sides) of a side surface portion, of the partition walls 4016, facing the aperture 4016c. Further, at the bottom portion of the aperture 4016b, a left side of the liquid-philic layer 4019a in the X axis direction is in contact with the side surface portion, of the partition walls 4016, facing the aperture 4016b, and similarly, at the bottom portion of the aperture 4016c, a right side of the liquid-philic layer 4019b in the X axis direction is in contact with the side surface portion, of the partition walls 4016, facing the aperture 4016c.

In addition, at the bottom portion of the aperture 4016b before the formation of an organic semiconductor layer, an exposed portion of an insulating layer 4013 (i.e., an exposed portion 4013a) occupies a greater area in the right side of the bottom portion in the X axis direction compared to in the left side, as illustrated in FIG. 9C. Similarly, at the bottom portion of the aperture 4016c before the formation of an organic semiconductor layer, an exposed portion of the insulating layer 4013 (i.e., an exposed portion 4013b) occupies a greater area in the left side of the bottom portion in the X axis direction compared to in the right side, as illustrated in FIG. 9C.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In addition, in the present embodiment, the source electrodes 4014a, 4014b and the drain electrodes 4014c, 4014d have the respective shapes as illustrated in FIG. 9C. As such, the areas of the electrodes facing the corresponding electrode increase, and further, a so-called "sneak current" is reduced.

[Embodiment 5]

Figure 10A:
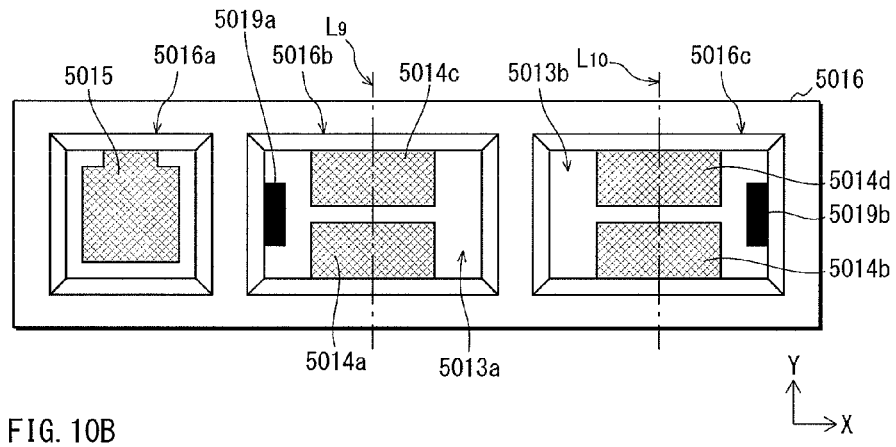
FIG. 10A is a schematic plan view illustrating, in a structure of an organic EL display panel pertaining to embodiment 5, a partial structure of a TFT substrate.

In the following, description is provided on a structure of a TFT substrate pertaining to embodiment 5 of the present disclosure, with reference to FIG. 10A. FIG. 10A corresponds to FIG. 3A in embodiment 1, and other than differences between the structures illustrated in FIG. 10A and FIG. 3A, embodiment 5 is similar to embodiments 1, 2, 3, 4, etc. As such, the structures similar between embodiment 5 and embodiments 1, 2, 3, 4, etc., are not illustrated in the drawings nor will be described in the following.

As illustrated in FIG. 10A, partition walls 5016 in the TFT substrate pertaining to the present embodiment define three apertures, namely apertures 5016a, 5016b, 5016c. Further, each of the apertures 5016a, 5016b, 5016c has an opening having a quadrilateral shape and a bottom portion having a quadrilateral shape, similar as in embodiments 1, 2, and 3 above. At the bottom portion of the aperture 5016b, a source electrode 5014a and a drain electrode 5014c each having an outline of a substantially square shape or a rectangular shape are disposed. Similarly, at bottom portion of the aperture 5016c, a source electrode 5014b and a drain electrode 5014d each having an outline of a substantially square shape or a rectangular shape are disposed.

At the bottom portion of the aperture 5016b, the source electrode 5014a and the drain electrode 5014c are disposed such that a center of area of each of the source electrode 5014a and the drain electrode 5014c in the X axis direction substantially coincides with a center of area (center $L_9$) of the bottom portion in the X axis direction. Similarly, at the bottom portion of the aperture 5016c, the source electrode 5014b and the drain electrode 5014d are disposed such that a center of area of each of the source electrode 5014b and the drain electrode 5014d in the X axis direction substantially coincides with a center of area (center $L_{10}$) of the bottom portion in the X axis direction.

In the present embodiment, and similar as in the above-described embodiments, a liquid-philic layer 5019a is disposed at the bottom portion of the aperture 5016b, and a liquid-philic layer 5019b is disposed at the bottom portion of the aperture 5016c. The liquid-philic layer 5019a is disposed such that a center of area of the liquid-philic layer 5019a is offset in the left direction along the X axis with respect to the center of area (center $L_9$) of the bottom portion of the aperture 5016b. Similarly, the liquid-philic layer 5019b is disposed such that a center of area of the liquid-philic layer 5019b is offset in the right direction along the X axis with respect to the center of area (center $L_{10}$) of the bottom portion of the aperture 5016c. Further, only a left side in the X axis direction of the liquid-philic layer 5019a is in contact with a side surface portion of the partition walls 5016 facing the aperture 5016b, and both sides (i.e., upper and lower sides) in the Y axis direction of the liquid-philic layer 5019a are located apart from the side surface portion facing the aperture 5016b. Similarly, only a right side in the X axis direction of the liquid-philic layer 5019b is in contact with a side surface portion of the partition walls 5016 facing the aperture 5016c, and both sides (i.e., upper and lower sides) in the Y axis direction of the liquid-philic layer 5019b are located apart from the side surface portion facing the aperture 5016c.

According to the above-described structure of the present embodiment, similar as in the above-described embodiments, at the bottom portion of the aperture 5016b, a center of a total of areas of the source electrode 5014a, the drain electrode 5014c, and the liquid-philic layer 5019a is offset in the left direction along the X axis from the center of area (center $L_9$) of the bottom portion of the aperture 5016b in the X axis direction. Similarly, at the bottom portion of the aperture 5016c, a center of a total of areas of the source electrode 5014b, the drain electrode 5014d, and the liquid-philic layer 5014a is offset in the right direction along the X axis from the center of area (center $L_{10}$) of the bottom portion of the aperture 5016c in the X axis direction.

In addition, at the bottom portion of the aperture 5016b before the formation of an organic semiconductor layer, an area of an insulating layer 5013 remaining exposed (i.e., an area of an exposed portion 5013a) is greater in the right side of the bottom portion in the X axis direction compared to in the left side, as illustrated in FIG. 10A. Similarly, at the bottom portion of the aperture 5016c before the formation of an organic semiconductor layer, an area of the insulating layer 5013 remaining exposed (i.e., an area of an exposed portion 5013b) is greater in the left side of the bottom portion in the X axis direction compared to in the right side, as illustrated in FIG. 10A.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In the present embodiment, and similar as in the above-described embodiments, the liquid-philic layers 5019a, 5019b are formed by using the same material as used for forming the source electrodes 5014a, 5014b and the drain electrodes 5014c, 5014d.

[Embodiment 6]

Figure 10B:
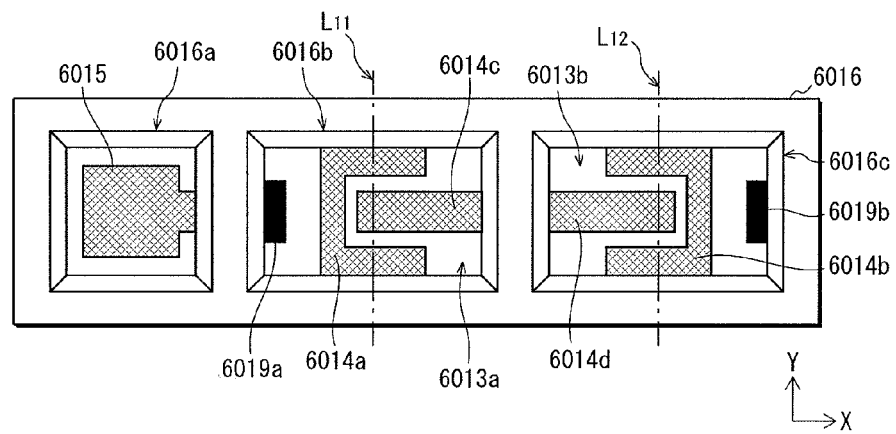
FIG. 10B is a schematic plan view illustrating, in a structure of an organic EL display panel pertaining to embodiment 6, a partial structure of a TFT substrate.

In the following, description is provided on a structure of a TFT substrate pertaining to embodiment 6 of the present disclosure, with reference to FIG. 10B. FIG. 10B corresponds to FIG. 3A in embodiment 1, and other than differences between the structures illustrated in FIG. 10B and FIG. 3A, embodiment 6 is similar to embodiments 1, 2, 3, 4, 5, etc. As such, the structures similar between embodiment 6 and embodiments 1, 2, 3, 4, 5, etc., are not illustrated in the drawings nor will be described in the following.

As illustrated in FIG. 10B, partition walls 6016 in the TFT substrate pertaining to the present embodiment define three apertures, namely apertures 6016a, 6016b, 6016c. Further, each of the apertures 6016a, 6016b, 6016c has an opening having a quadrilateral shape and a bottom portion having a quadrilateral shape, similar as in embodiments 1, 2, 3, and 5 above. Further, a drain electrode 6014c disposed at the bottom portion of the aperture 6016b has a rectangular shape, and similarly, a drain electrode 6014d disposed at the bottom portion of the aperture 6016c has a rectangular shape.

On the other hand, a source electrode 6014a disposed at the bottom portion of the aperture 6016b has a U-shape in plan view, and faces a part of the drain electrode 6014c at three sides thereof. Similarly, a source electrode 6014b disposed at the bottom portion of the aperture 6016c has a U-shape in plan view, and faces a part of the drain electrode 6014d at three sides thereof.

Further, at the bottom portion of the aperture 6016b, the source electrode 6014a is disposed such that a center of area of the source electrode 6014a in the X axis direction is offset in the left direction along the X axis from a center of area (center $L_{11}$) of the bottom portion of the aperture 6016b in the X axis direction. Similarly, at the bottom portion of the aperture 6016c, the source electrode 6014b is disposed such that a center of area of the source electrode 6014b in the X axis direction is offset in the right direction along the X axis from a center of area (center $L_{12}$) of the bottom portion of the aperture 6016c in the X axis direction.

On the other hand, at the bottom portion of the aperture 6016b, the drain electrode 6014c is disposed such that a center of area of the drain electrode 6014c in the X axis direction is offset in the right direction along the X axis from the center of area (center $L_{11}$) of the bottom portion of the aperture 6016b in the X axis direction. Similarly, at the bottom portion of the aperture 6016c, the drain electrode 6014d is disposed such that a center of area of the drain electrode 6014d in the X axis direction is offset in the left direction along the X axis from the center of area (center $L_{12}$) of the bottom portion of the aperture 6016c in the X axis direction.

In the present embodiment, and similar as in the above-described embodiments, a liquid-philic layer 6019a is disposed at the bottom portion of the aperture 6016b, and a liquid-philic layer 6019b is disposed at the bottom portion of the aperture 6016c. The liquid-philic layer 6019a is disposed such that a center of area of the liquid-philic layer 6019a is offset in the left direction along the X axis with respect to the center of area (center $L_{11}$) of the bottom portion of the aperture 6016b. Similarly, the liquid-philic layer 6019b is disposed such that a center of area of the liquid-philic layer 6019b is offset in the right direction along the X axis with respect to the center of area (center $L_{12}$) of the bottom portion of the aperture 6016c. Further, only a left side in the X axis direction of the liquid-philic layer 6019a is in contact with a side surface portion of the partition walls 6016 facing the aperture 6016b, and both sides (i.e., upper and lower sides) in the Y axis direction of the liquid-philic layer 6019a are located apart from the side surface portion facing the aperture 6016b. Similarly, only a right side in the X axis direction of the liquid-philic layer 6019b is in contact with a side surface portion of the partition walls 6016 facing the aperture 6016c, and both sides (i.e., upper and lower sides) in the Y axis direction of the liquid-philic layer 6019b are located apart from the side surface portion facing the aperture 6016c.

According to the above-described structure, at the bottom portion of the aperture 6016b pertaining to the present embodiment, a center of a total of areas of the source electrode 6014a, the drain electrode 6014c, and the liquid-philic layer 6019a is offset in the left direction along the X axis from the center of area (center $L_{11}$) of the bottom portion of the aperture 6016b in the X axis direction. Similarly, at the bottom portion of the aperture 6016c, a center of a total of areas of the source electrode 6014b, the drain electrode 6014d, and the liquid-philic layer 6019b is offset in the right direction along the X axis from the center of area (center $L_{12}$) of the bottom portion of the aperture 6016c in the X axis direction.

In addition, in the TFT substrate pertaining to the present embodiment, each of upper and lower portions of the source electrode 6014a in the Y axis direction is in contact with the side surface portion of the partition walls 6016 facing the aperture 6016b while each of left and right portions of the source electrode 6014a in the X axis direction is located apart from the side surface portion facing the aperture 6016b. On the other hand, a right portion of the drain electrode 6014c in the X axis direction is in contact with the side surface portion facing the aperture 6016b while a left portion of the drain electrode 6014c in the X axis direction is located apart from the side surface portion facing the aperture 6016b. Similarly, at the bottom portion of the aperture 6016c, each of upper and lower portions of the source electrode 6014b in the Y axis direction is in contact with the side surface portion of the partition walls 6016 facing the aperture 6016c while each of left and right portions of the source electrode 6014b in the X axis direction is located apart from the side surface portion facing the aperture 6016c. On the other hand, a left portion of the drain electrode 6014d in the X axis direction is in contact with the side surface portion facing the aperture 6016c while a right portion of the drain electrode 6014d in the X axis direction is located apart from the side surface portion facing the aperture 6016c.

In addition, at the bottom portion of the aperture 6016b before the formation of an organic semiconductor layer, an area of an insulating layer 6013 remaining exposed (i.e., an area of an exposed portion 6013a) is greater in the right side of the bottom portion in the X axis direction compared to in the left side, as illustrated in FIG. 10B. Similarly, at the bottom portion of the aperture 6016c before the formation of an organic semiconductor layer, an area of the insulating layer 6013 remaining exposed (i.e., an area of an exposed portion 6013b) is greater in the left side of the bottom portion in the X axis direction compared to in the right side, as illustrated in FIG. 10B.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In the present embodiment, and similar as in the above-described embodiments, the liquid-philic layers 6019a, 6019b are formed by using the same material as used for forming the source electrodes 6014a, 6014b and the drain electrodes 6014c, 6014d.

[Embodiment 7]

Figure 10C:
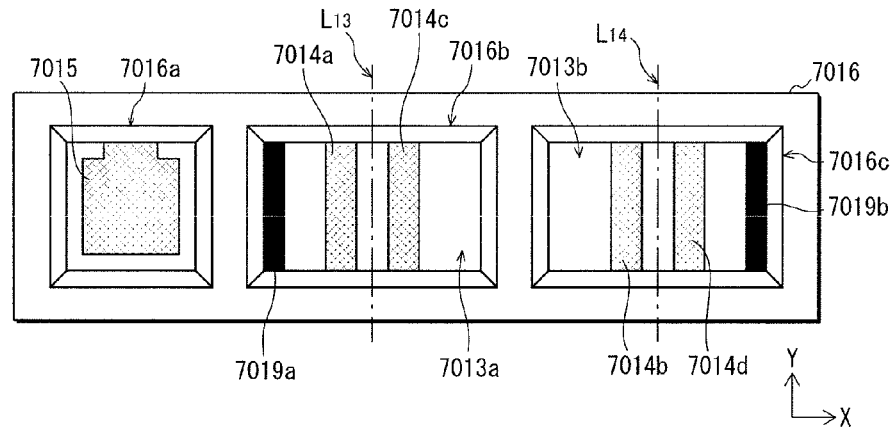
FIG. 10C is a schematic plan view illustrating, in a structure of an organic EL display panel pertaining to embodiment 7, a partial structure of a TFT substrate.

In the following, description is provided on a structure of a TFT substrate pertaining to embodiment 7 of the present disclosure, with reference to FIG. 10C. FIG. 10C corresponds to FIG. 3A in embodiment 1, and other than differences between the structures illustrated in FIG. 10C and FIG. 3A, embodiment 7 is similar to embodiments 1, 2, 3, 4, 5, 6, etc. As such, the structures similar between embodiment 7 and embodiments 1, 2, 3, 4, 5, 6, etc., are not illustrated in the drawings nor will be described in the following.

As illustrated in FIG. 10C, partition walls 7016 in the TFT substrate pertaining to the present embodiment define three apertures, namely apertures 7016a, 7016b, 7016c. Further, each of the apertures 7016a, 7016b, 7016c has an opening having a quadrilateral shape and a bottom portion having a quadrilateral shape, similar as in embodiments 1, 2, 3, 5, and 6 above. At the bottom portion of the aperture 7016b, a source electrode 7014a and a drain electrode 7014c each having an outline of a substantially square shape or a rectangular shape are disposed. Similarly, at bottom portion of the aperture 7016c, a source electrode 7014b and a drain electrode 7014d each having an outline of a substantially square shape or a rectangular shape are disposed.

At the bottom portion of the aperture 7016b, a liquid-philic layer 7019a is additionally disposed, and at the bottom portion of the aperture 7016c, a liquid-philic layer 7019b is additionally disposed. Similar as in the above-described embodiments, the liquid-philic layers 7016a, 7016b are formed by using the same material as used for forming the source electrodes 7014a, 7014b and the drain electrodes 7014c, 7014d.

Further, at the bottom portion of the aperture 7016b, the source electrode 7014a is disposed such that a center of area of the source electrode 7014a is offset in the left direction along the X axis from a center of area (center $L_{13}$) of the bottom portion of the aperture 7016b in the X axis direction. On the other hand, at the bottom portion of the aperture 7016b, the drain electrode 7014c is disposed such that a center of area of the drain electrode 7014c is offset in the right direction along the X axis from the center of area (center $L_{13}$) of the bottom portion of the aperture 7016b in the X axis direction. The source electrode 7014a and the drain electrode 7014c are disposed at the bottom portion of the aperture 7016b so as to be symmetrical with respect to a line along the center $L_{13}$ of the bottom portion of the aperture 7016b.

Similarly, at the bottom portion of the aperture 7016c, the source electrode 7014b is disposed such that a center of area of the source electrode 7014b is offset in the left direction along the X axis from a center of area (center $L_{14}$) of the bottom portion of the aperture 7016c in the X axis direction. On the other hand, at the bottom portion of the aperture 7016c, the drain electrode 7014d is disposed such that a center of area of the drain electrode 7014d is offset in the right direction along the X axis from the center of area (center $L_{14}$) of the bottom portion of the aperture 7016c in the X axis direction. The source electrode 7014b and the drain electrode 7014d are disposed at the bottom portion of the aperture 7016c so as to be symmetrical with respect to a line along the center $L_{14}$ of the bottom portion of the aperture 7016c.

In the present embodiment, and similar as in the above-described embodiments, a liquid-philic layer 7019a is disposed at the bottom portion of the aperture 7016b, and a liquid-philic layer 7019b is disposed at the bottom portion of the aperture 7016c. The liquid-philic layer 7019a is disposed such that a center of area of the liquid-philic layer 7019a is offset in the left direction along the X axis with respect to the center of area (center $L_{13}$) of the bottom portion of the aperture 7016b. Similarly, the liquid-philic layer 7019b is disposed such that a center of area of the liquid-philic layer 7019b is offset in the right direction along the X axis with respect to the center of area (center $L_{14}$) of the bottom portion of the aperture 7016c. Further, the liquid-philic layer 7019a is in contact with a side surface portion of the partition walls 7016 facing the aperture 7016b at three sides thereof, namely a left side thereof in the X axis direction and both sides (i.e., upper and lower sides) thereof in the Y axis direction. Similarly, the liquid-philic layer 7019b is in contact with a side surface portion of the partition walls 7016 facing the aperture 7016c at three sides thereof, namely a right side thereof in the X axis direction and both sides (i.e., upper and lower sides) thereof in the Y axis direction.

At the bottom portion of the aperture 7016b pertaining to the present embodiment, a center of a total of areas of the source electrode 7014a, the drain electrode 7014c, and the liquid-philic layer 7019a is offset in the left direction along the X axis from the center of area (center $L_{13}$) of the bottom portion of the aperture 7016b in the X axis direction. Similarly, at the bottom portion of the aperture 7016c, a center of a total of areas of the source electrode 7014b, the drain electrode 7014d, and the liquid-philic layer 7019b is offset in the right direction along the X axis from the center of area (center $L_{14}$) of the bottom portion of the aperture 7016c in the X axis direction.

In addition, at the bottom portion of the aperture 7016b before the formation of an organic semiconductor layer, an area of an insulating layer 7013 remaining exposed (i.e., an area of an exposed portion 7013a) is greater in the right side of the bottom portion in the X axis direction compared to in the left side, as illustrated in FIG. 10C. Similarly, at the bottom portion of the aperture 7016c before the formation of an organic semiconductor layer, an area of the insulating layer 7013 remaining exposed (i.e., an area of an exposed portion 7013b) is greater in the left side of the bottom portion in the X axis direction compared to in the right side, as illustrated in FIG. 10C.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In the present embodiment, and similar as in the above-described embodiments, the liquid-philic layers 7019a, 7019b are formed by using the same material as used for forming the source electrodes 7014a, 7014b and the drain electrodes 7014c, 7014d.

[Other Matters]

In the above-described embodiments 1 through 7, description has been of examples where, within one side of an aperture that is in a direction of an adjacent aperture, a portion exists where a source electrode, a drain electrode, not a liquid-philic layer exists and thus, where an insulating layer is in direct contact with an organic semiconductor layer. However, the one side may include a portion of the source electrode and/or a portion of the drain electrode and or a portion of the liquid-philic layer, provided that at a bottom portion of the aperture, a center of a total of areas of the source electrode, the drain electrode, and the liquid-philic layer is offset from a center of area of the bottom portion in a direction opposite the direction of the adjacent aperture.

In the above-described embodiments 1 through 7, description has been provided by taking as an example a TFT substrate to be used in the organic EL display panel 10. However, the TFT substrate may alternatively be used in a liquid crystal display panel, a field emission display panel, etc. Further, the TFT substrate may also be used in an electronic paper, etc.

In addition, the materials described in the above-described embodiments are mere examples of such materials that may be used. As such, other materials may be used as necessary.

In addition, as illustrated in FIG. 2, the organic EL display panel 10 pertaining to embodiment 1 is a top-emission type organic EL display panel. However, the organic EL display panel may alternatively be a bottom-emission type organic EL display panel. In such a case, the materials to be used for forming the organic EL display panel and the layout design of the organic EL display panel may be changed as necessary.

Figure 11A:
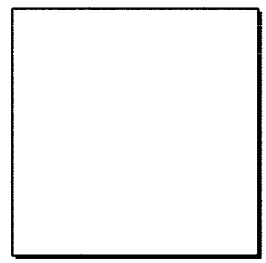
FIG. 11A is a schematic plan view illustrating a shape of an opening of an aperture defined by partition walls in a TFT substrate pertaining to modification 1.
Figure 11B:
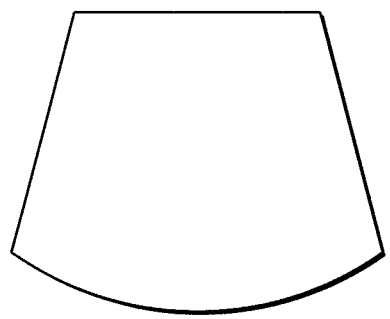
FIG. 11B is a schematic plan view illustrating a shape of an opening of an aperture defined by partitions wall in a TFT substrate pertaining to modification 2.
Figure 11C:
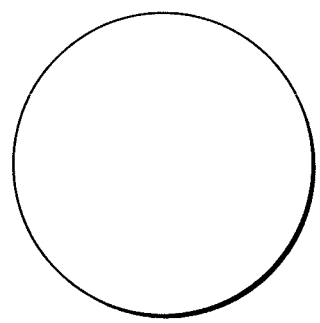
FIG. 11C is a schematic plan view illustrating a shape of an opening of an aperture defined by partition walls in a TFT substrate pertaining to modification 3.
Figure 12A:
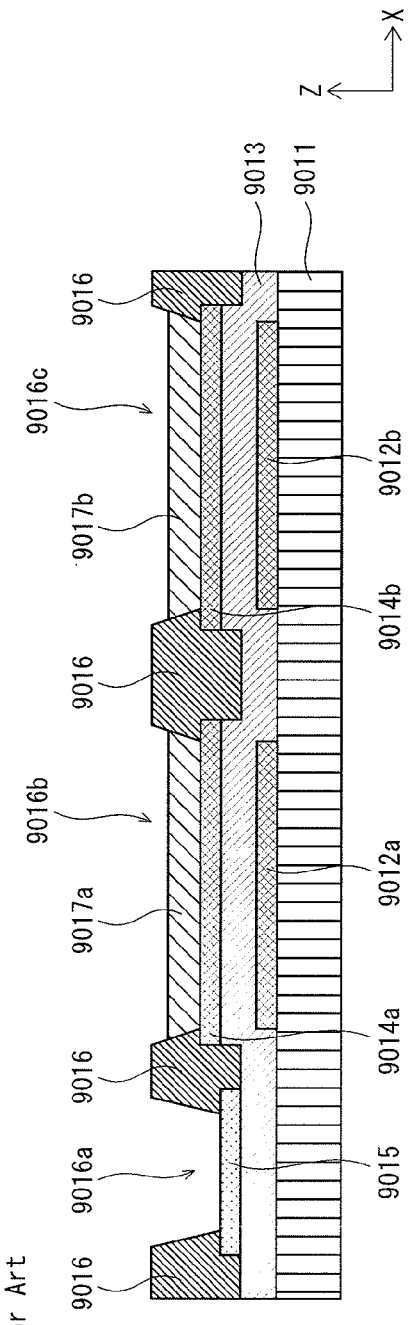
FIG. 12A is a cross-sectional view illustrating, in a structure of an organic EL display device pertaining to conventional technology, a partial structure of a TFT substrate.
Figure 12B:
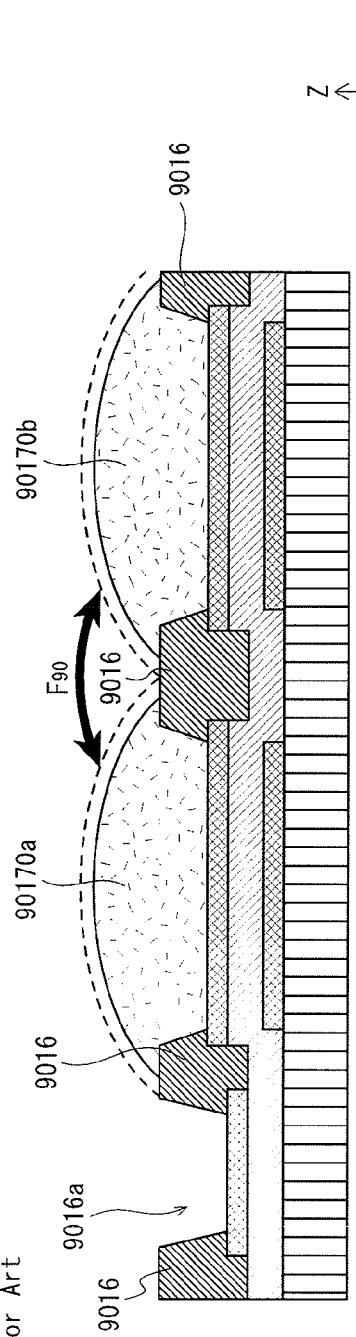
FIG. 12B is a cross-sectional view illustrating a procedure pertaining to application of organic semiconductor ink among procedures involved in the manufacturing of the TFT substrate pertaining to conventional technology.

In addition, in the above, description has been provided that the apertures defined by the partition walls each have an opening having a rectangular shape or a substantially circular shape. However, the apertures defined by the partition walls may alternatively have openings of various shapes. For instance, an aperture may have an opening having a square shape as illustrated in FIG. 11A, or may have an opening having a shape as illustrated in FIG. 11B composed of one side being a circular arc and three remaining sides being straight lines. Further, an aperture may have an opening having a circular shape as illustrated in FIG. 9C. In addition, an aperture may have an opening having a circular shape as illustrated in FIG. 11C, and another aperture having the shape of a circular arc may be provided so as to partially surround the circular aperture. Needless to say, the shape of an opening of an aperture corresponding to a channel portion and the shape of an opening of an aperture corresponding to a non-channel portion are interchangeable.

In addition, description has been provided above of a structure for preventing organic semiconductor ink applied with respect to one aperture among two adjacent apertures and organic semiconductor ink applied with respect to the other one of the two adjacent apertures from meeting and blending with each other. However, the above-described structure is also applicable to cases where three or more adjacent apertures exist. When applied to such cases, the meeting and blending of organic semiconductor ink between the three or more adjacent apertures can be prevented.

In addition, description has been provided in the above on a structure including an organic semiconductor layer formed by using organic semiconductor ink. However, a similar structure may alternatively be used for a structure including an inorganic semiconductor layer formed by using inorganic semiconductor ink. In such a case, the same effects as described above can be achieved. For instance, an amorphous metal oxide semiconductor may be used as the inorganic semiconductor material. It is expected for such semiconductors to be applied to displays, electronic papers, etc., for the transparency possessed thereby.

In terms of mobility, such semiconductors are materials that may potentially realize a movability of 3 to 20 $cm^2$/Vs, which is desirable in high performance LCD and organic electro-luminescence (EL) displays.

Some commonly-known, representative examples of an amorphous metal oxide semiconductor include an amorphous indium zinc oxide semiconductor (a-InZnO) containing indium (In) and zinc (Zn) and an amorphous indium gallium zinc oxide semiconductor (a-InGaZnO), which includes gallium (Ga) as a metal component in addition to indium (In) and zinc (Zn).

For details concerning such inorganic semiconductors, reference may be made to disclosure in International Application No. WO 2012/035281.

[Industrial Applicability]

The invention disclosed in the present disclosure is applicable to a display device provided with a panel, such as an organic EL display panel, and is useful for realizing a TFT device having high quality by realizing high-definition.

REFERENCE SIGNS LIST 1 organic EL display device
10 organic EL display panel
20 drive control circuit portion
21-24 drive circuit
25 control circuit
101 TFT substrate
102 planarizing film
102a contact hole
103 anode
104 light-transmissive conduction film
105 hole injection layer
106 bank
107 hole transport layer
108 organic light-emitting layer
109 electron transport layer
110 cathode
111 sealing layer
112 adhesion layer
113 CF substrate
501 mask
1011, 1131 CF substrate
1012a, 1012b gate electrode
1013 insulating layer
1014a, 1014b, 2014a, 2014b, 3014a, 3014b, 4014a, 4014b, 5014a, 5014b, 6014a, 6014b, 7014a, 7014b source electrode
1014c, 1014d, 2014c, 2014d, 3014c, 3014d, 4014c, 4014d, 5014c, 5014d, 6014c, 6014d, 7014c, 7014d drain electrode
1015, 2015, 3015, 4015, 5015, 6015, 7015 connection wire
1016, 2016, 3016, 4016, 5016, 6016, 7016 partition walls
1016a, 1016b, 1016c, 2016a, 2016b, 2016c, 3016a, 3016b, 3016c, 4016a, 4016b, 4016c, 5016a, 5016b, 5016c, 6016a, 6016b, 6016c, 7016a, 7016b,
7016c aperture
1017a, 1017b organic semiconductor layer
1018 passivation film
1132 color filter
1133 black matrix
10160 photoresist material film
10170a, 10170b organic semiconductor ink

The invention claimed is:

1. A thin film transistor device comprising:
a first thin film transistor element and a second thin film transistor element that are arranged so as to be adjacent to each other with a gap therebetween, wherein
each of the first thin film transistor element and the second thin film transistor element comprises:
a gate electrode;
an insulating layer disposed on the gate electrode;
a source electrode and a drain electrode disposed on the insulating layer with a gap therebetween;
a semiconductor layer disposed on the source electrode and the drain electrode so as to cover the source electrode and the drain electrode and fill the gap between the source electrode and the drain electrode, and being in contact with the source electrode and the drain electrode; and
a liquid-philic layer disposed on the insulating layer and having higher liquid philicity than the insulating layer, the liquid-philic layer being separate from the source electrode and the drain electrode, wherein
the thin film transistor device further comprises partition walls disposed on the insulating layer and partitioning the semiconductor layer of the first thin film transistor element from the semiconductor layer of the second thin film transistor element, the partition walls having liquid-repellant surfaces and defining a first aperture and a second aperture,
the first aperture surrounds at least a part of each of the source electrode, the drain electrode, and the liquid-philic layer of the first thin film transistor element,
the second aperture is adjacent to the first aperture and surrounds at least a part of each of the source electrode, the drain electrode, and the liquid-philic layer of the second thin film transistor element,
a bottom portion of each of the first and second apertures includes a source electrode portion being a bottom portion of the source electrode, a drain electrode portion being a bottom portion of the drain electrode, and a liquid-philic layer portion being a bottom portion of the liquid-philic layer,
in plan view of the bottom portion of the first aperture, a center of area of the liquid-philic layer portion is offset from a center of area of the bottom portion in a direction opposite a direction of the second aperture, and
in plan view of the bottom portion of the second aperture, a center of area of the liquid-philic layer portion is offset from a center of area of the bottom portion in a direction opposite a direction of the first aperture.

2. The thin film transistor device of claim 1, wherein
at the bottom portion of the first aperture, a portion exists where the source electrode portion, the drain electrode portion, and the liquid-philic layer portion do not exist and thus, where the insulating layer of the first thin film transistor element is in direct contact with the semiconductor layer of the first thin film transistor element, the portion being within an area of the bottom portion located in the direction of the second aperture, and
at the bottom portion of the second aperture, a portion exists where the source electrode portion, the drain electrode portion, and the liquid-philic layer portion do not exist and thus, where the insulating layer of the second thin film transistor element is in direct contact with the semiconductor layer of the second thin film transistor element, the portion being within an area of the bottom portion located in the direction of the first aperture.

3. The thin film transistor device of claim 2, wherein
at the bottom portion of the first aperture,
the portion where the source electrode portion, the drain electrode portion, and the liquid-philic layer portion do not exist and thus, where the insulating layer of the first thin film transistor element is in direct contact with the semiconductor layer of the first thin film transistor element, also exists within an area of the bottom portion located in the direction opposite the direction of the second aperture, and
in plan view, the portion occupies a greater area at the area of the bottom portion located in the direction of the second aperture than at the area of the bottom portion located in the direction opposite the direction of the second aperture, and
at the bottom portion of the second aperture,
the portion where the source electrode portion, the drain electrode portion, and the liquid-philic layer portion do not exist and thus, where the insulating layer of the second thin film transistor element is in direct contact with the semiconductor layer of the second thin film transistor element, also exists within an area of the bottom portion located in the direction opposite the direction of the first aperture, and
in plan view, the portion occupies a greater area at the area of the bottom portion located in the direction of the first aperture than at the area of the bottom portion located in the direction opposite the direction of the first aperture.

4. The thin film transistor device of claim 1, wherein
in each of the first and second thin film transistor elements,
the liquid-philic layer is formed by using a same material as used for forming the source electrode and the drain electrode, and
the liquid-philic layer is located apart from each of the source electrode and the drain electrode.

5. The thin film transistor device of claim 1, wherein
in plan view of the bottom portion of the first and second apertures,
at the bottom portion of each of the first and second apertures, a center of area of each of the source electrode portion and the drain electrode portion coincides with the center of area of the bottom portion.

6. The thin film transistor device of claim 1, wherein
in plan view of the bottom portion of the first aperture,
a center of a total of areas of the source electrode portion, the drain electrode portion, and the liquid-philic layer portion is offset from the center of area of the bottom portion in the direction opposite the direction of the second aperture, and
in plan view of the bottom portion of the second aperture,
a center of a total of areas of the source electrode portion, the drain electrode portion, and the liquid-philic layer portion is offset from the center of area of the bottom portion in the direction opposite the direction of the first aperture.

7. The thin film transistor device of claim 1, wherein
at the bottom portion of the first aperture,
a side of the liquid-philic layer portion located in the direction opposite the direction of the second aperture is in contact with a side surface portion, of the partition walls, facing the first aperture, and
at the bottom portion of the second aperture,
a side of the liquid-philic layer portion located in the direction opposite the direction of the first aperture is in contact with a side surface portion, of the partition walls, facing the second aperture.

8. The thin film transistor device of claim 1, wherein
a liquid repellency of the surfaces of the partition walls is greater than a liquid repellency of a surface of the insulating layer, in each of the first and second thin film transistor elements, that is in contact with the semiconductor layer, and
the liquid repellency of the surface of the insulating layer, in each of the first and second thin film transistor elements, that is in contact with the semiconductor layer is greater than a liquid repellency of a surface of each of the source electrode, the drain electrode, and the liquid-philic layer in each of the first and second thin film transistor elements.

9. An organic EL display element comprising:
the thin film transistor device of claim 1;
a planarizing film formed above the thin film transistor device and having a contact hole formed therein;
a lower electrode formed on the planarizing film so as to cover the planarizing film and a side surface of the planarizing film defining the contact hole, and electrically connected with one of the source electrode and the drain electrode in the first thin film transistor element;
an upper electrode formed above the lower electrode; and
an organic light-emitting layer interposed between the lower electrode and the upper electrode.

10. An organic EL display device comprising the organic EL display element of claim 9.

11. A method of manufacturing a thin film transistor device comprising:
forming a first gate electrode and a second gate electrode on a substrate so as to be adjacent to each other with a gap therebetween;
forming an insulating layer so as to cover the first gate electrode and the second gate electrode;
forming first and second source electrodes, first and second drain electrodes, and first and second liquid-philic layers on the insulating layer, wherein (i) the first source electrode and the first drain electrode are formed with respect to the first gate electrode with a gap therebetween, (ii) the second source electrode and the second drain electrode are formed with respect to the second gate electrode with a gap therebetween, (iii) the first liquid-philic layer is formed with respect to the first source electrode and the first drain electrode so as to be located apart from the first source electrode and the first drain electrode, the first liquid-philic layer having higher liquid philicity than the insulating layer, and (iv) the second liquid-philic layer is formed with respect to the second source electrode and the second drain electrode so as to be located apart from the second source electrode and the second drain electrode, the second liquid-philic layer having higher liquid philicity than the insulating layer;
depositing a layer of photosensitive resist material such that, above the insulating layer, the layer of photosensitive resist material covers the first and second source electrodes and the first and second drain electrodes;
forming partition walls on the insulating layer by performing mask exposure and patterning of the layer of photosensitive resist material, the partition walls having liquid-repellant surfaces and defining a first aperture and a second aperture that is adjacent to the first aperture, the first aperture surrounding at least a part of each of the first source electrode, the first drain electrode, and the first liquid-philic layer, the second aperture surrounding at least a part of each of the second source electrode, the second drain electrode, and the second liquid-philic layer; and forming a first semiconductor layer with respect to the first aperture and a second semiconductor layer with respect to the second aperture by applying semiconductor material with respect to the corresponding aperture and drying the semiconductor material so applied, wherein (i) the first semiconductor layer is formed so as to be in contact with the first source electrode and the first drain electrode, and (ii) the second semiconductor layer is formed so as to be in contact with the second source electrode and the second drain electrode, wherein the partition walls are formed such that a bottom portion of each of the first and second apertures includes a source electrode portion being a bottom portion of the corresponding source electrode, a drain electrode portion being a bottom portion of the corresponding drain electrode, and a liquid-philic layer portion being a bottom portion of the corresponding liquid-philic layer, in plan view of the bottom portion of the first aperture, a center of area of the liquid-philic layer portion is offset from a center of area of the bottom portion in a direction opposite a direction of the second aperture, and in plan view of the bottom portion of the second aperture, a center of area of the liquid-philic layer portion is offset from a center of area of the bottom portion in a direction opposite a direction of the first aperture.

12. The method of claim 11, wherein
the partition walls are formed such that
at the bottom portion of the first aperture, a portion exists where the source electrode portion, the drain electrode portion, and the liquid-philic layer portion do not exist and thus, where the insulating layer is to come in direct contact with the first semiconductor layer, the portion being within an area of the bottom portion located in the direction of the second aperture, and at the bottom portion of the second aperture, a portion exists where the source electrode portion, the drain electrode portion, and the liquid-philic layer portion do not exist and thus, where the insulating layer is to come in direct contact with the second semiconductor layer, the portion being within an area of the bottom portion located in the direction of the first aperture.

13. The method of claim 12, wherein
the partition walls are formed such that
at the bottom portion of the first aperture, the portion where the source electrode portion, the drain electrode portion, and the liquid-philic layer portion do not exist and thus, where the insulating layer is to come in direct contact with the first semiconductor layer, also exists within an area of the bottom portion located in the direction opposite the direction of the second aperture, and in plan view, the portion occupies a greater area at the area of the bottom portion located in the direction of the second aperture than at the area of the bottom portion located in the direction opposite the direction of the second aperture, and at the bottom portion of the second aperture, the portion where the source electrode portion, the drain electrode portion, and the liquid-philic layer portion do not exist and thus, where the insulating layer is to come in direct contact with the second semiconductor layer, also exists within an area of the bottom portion located in the direction opposite the direction of the first aperture, and in plan view, the portion occupies a greater area at the area of the bottom portion located in the direction of the first aperture than at the area of the bottom portion located in the direction opposite the direction of the first aperture.

14. The method of claim 11, wherein
the forming, on the insulating layer, of the first and second source electrodes, the first and second drain electrodes, and the first and second liquid-philic layers includes sub-steps of:

forming a metal layer on the insulating layer; and
etching the metal layer so formed.

15. The method of claim 11, wherein
the forming of the insulating layer, the forming of the first and second source electrodes, the first and second drain electrodes, and the first and second liquid-philic layers, the forming of the partition walls, and the forming of the first and second semiconductor layers are performed such that a liquid repellency of the surfaces of the partition walls is greater than a liquid repellency of a surface of the insulating layer that is to come in contact with the first and second semiconductor layers, and the liquid repellency of the surface of the insulating layer is greater than a liquid repellency of a surface of each of the first and second source electrodes, each of the first and second drain electrodes, and each of the first and second liquid-philic layers.

* * * * *